United States Patent
Ho et al.

(10) Patent No.: US 8,711,593 B2
(45) Date of Patent: Apr. 29, 2014

(54) GENERALIZED AC-DC SYNCHRONOUS RECTIFICATION TECHNIQUES FOR SINGLE- AND MULTI-PHASE SYSTEMS

(75) Inventors: Wing Choi Ho, New Territories (HK); Ron Shu Yuen Hui, New Territories (HK); Xun Liu, New Territories (HK); Wai Pong Choi, Kowloon (HK)

(73) Assignee: ConvenientPower HK Ltd., Shatin, N.T. (HK)

( * ) Notice: Subject to any disclaimer, the term of this patent is extended or adjusted under 35 U.S.C. 154(b) by 1065 days.

(21) Appl. No.: 12/274,469

(22) Filed: Nov. 20, 2008

(65) Prior Publication Data

US 2010/0046264 A1 Feb. 25, 2010

Related U.S. Application Data

(63) Continuation-in-part of application No. 12/194,921, filed on Aug. 20, 2008.

(51) Int. Cl.
*H02M 7/06* (2006.01)
*H02M 7/217* (2006.01)

(52) U.S. Cl.
USPC .......................... 363/126; 363/127

(58) Field of Classification Search
USPC ........................ 363/21.06, 125–127
See application file for complete search history.

(56) References Cited

U.S. PATENT DOCUMENTS

| | | | |
|---|---|---|---|
| 4,412,277 A | 10/1983 | Mitchell | |
| 4,473,757 A * | 9/1984 | Farago et al. | 363/127 |
| 5,625,541 A | 4/1997 | Rozman | |
| 5,872,705 A | 2/1999 | Loftus, Jr. et al. | |
| 6,002,597 A * | 12/1999 | Rozman | 363/127 |
| 6,011,703 A | 1/2000 | Boylan et al. | |
| 6,038,148 A | 3/2000 | Farrington et al. | |
| 6,069,799 A | 5/2000 | Bowman et al. | |
| 6,084,792 A | 7/2000 | Chen et al. | |
| 6,240,318 B1 | 5/2001 | Phillips | |
| 6,288,920 B1 | 9/2001 | Jacobs et al. | |
| 6,301,139 B1 | 10/2001 | Patel | |
| 6,353,544 B1 * | 3/2002 | Lau | 363/21.12 |
| 6,366,485 B1 | 4/2002 | Fujisawa | |
| 6,563,719 B1 | 5/2003 | Hua et al. | |
| 6,583,993 B2 | 6/2003 | Hua | |

(Continued)

FOREIGN PATENT DOCUMENTS

| | | |
|---|---|---|
| CN | 1277750 A | 12/2000 |
| CN | 1380739 A | 11/2002 |

(Continued)

OTHER PUBLICATIONS

Miura et al., A Synchronous Rectification Using a Digital PLL Technique for Contactless Power Supplies, Oct. 2005, IEEE, vol. 41, No. 10, pp. 3997-3999.*

(Continued)

*Primary Examiner* — Jue Zhang

(74) *Attorney, Agent, or Firm* — Fenwick & West LLP

(57) ABSTRACT

Various circuit configurations and topologies are provided for single and multi-phase, single-level or multi-level, full and half-bridge rectifiers in which diodes are replaced by combinations of voltage-controlled self-driven active switches, current-controlled self-driven active switches and inductors in order to reduce the effects of conduction loss in the diodes.

12 Claims, 32 Drawing Sheets

(56) References Cited

U.S. PATENT DOCUMENTS

| | | |
|---|---|---|
| 7,269,038 B2 | 9/2007 | Shekhawat et al. |
| 2002/0021577 A1 | 2/2002 | Lau |
| 2003/0095423 A1 | 5/2003 | Hirst |
| 2006/0062032 A1* | 3/2006 | Soldano .................. 363/125 |
| 2007/0029965 A1 | 2/2007 | Hui |
| 2007/0058402 A1 | 3/2007 | Shekhawat et al. |
| 2007/0152795 A1 | 7/2007 | Zeng et al. |

FOREIGN PATENT DOCUMENTS

| | | |
|---|---|---|
| CN | 1617435 A | 5/2005 |
| CN | 101040425 A | 9/2007 |
| CN | 101056068 A | 10/2007 |
| CN | 101154891 A | 4/2008 |
| EP | 1056190 A1 | 11/2000 |
| FR | 2900292 A1 | 10/2007 |
| WO | WO 96/01003 A1 | 1/1996 |

OTHER PUBLICATIONS

Davide Giacomini, A Novel Efficient Approach to Input Bridges, May 2008, International Rectifier, PCIM Europe, pp. 1-7.*

M.I. Mihaiu, "Toward the 'Ideal Diode' Using Power MOSFET in Full Wave Synchronous Rectifiers for Low Voltage Power Supplies", IEEE Transactions, 978-I-4244-1664 (Jun. 2008).

Blanc, J., "Practical Application of MOSFET Synchronous Rectifiers", Telecommunications Energy Conference, INTELEC'91 (Nov. 1991).

Blake et al., "Synchronous Rectifiers Versus Schottky Diodes: A Comparison of the Losses of a Synchronous Rectifier Versus the Losses of a Schottky Diode Rectifier", IEEE Applied Power Electronics Conference (APEC), 1994.

Xie et al., "A Novel High Frequency Current-Driven Synchronous Rectifier Applicable to Most Switching Topologies", IEEE Transactions on Power Electronics, vol. 16, No. 5 (Sep. 2001).

Murakami et al., "A Simple and Efficient Synchronous Rectifier for Forward DC-DC Converters", Applied Power Electronics Conference and Exposition (1993).

Alou et al., "A New Driving Scheme for Synchronous Rectifiers: Single Winding Self-Driven Synchronous Rectification", IEEE Transactions on Power Electronics, vol. 16, No. 6 (Nov. 2001).

Fernandez et al., "New Self-Driven Synchronous Rectification System for Converters with a Symmetrically Driven Transformer", IEEE Transactions on Industry Applications, vol. 41, No. 5 (Sep./Oct. 2005).

Chiu, Huang-Jen, "A High-Efficiency Soft-Switched AC/DC Converter with Current-Doubler Synchronous Rectification", IEEE Transactions on Industrial Electronics, vol. 52, No. 3 (Jun. 2005).

Tabisz et al., "A MOSFET Resonant Synchronous Rectifier for High-Frequency DC/DC Converters", Power Electronics Specialists Conference (PESC'90), 1990.

Jovanovic et al., "Evaluation of Synchronous-Rectification Efficiency Improvement Limits in Forward Converters", IEEE Transactions on Industrial Electronics, vol. 42, No. 4 (Aug. 1995).

Zhang et al., "Design Considerations and Performance Evaluations of Synchronous Rectification in Flyback Converters", IEEE Transactions on Power Electronics, vol. 13, No. 3 (May 1998).

Panov et al., "Design and Performance Evaluation of Low-Voltage/High-Current DC/DC On-Board Modules", IEEE Transactions on Power Electronics, vol. 16, No. 1 (Jan. 2001).

Qian et al., "Self-Driven Synchronous Rectification Scheme Without Undesired Gate-Voltage Discharge for DC-DC Converters with Symmetrically Driven Transformers", IEEE Transactions on Power Electronics, vol. 23, No. 1 (Jan. 2008).

Miura et al., "A Synchronous Rectification Using a Digital PLL Technique for Contactless Power Supplies", IEEE Transactions on Magnetics, vol. 41, No. 10 (Oct. 2005).

de Souza et al., "High Power Factor Rectifier with Reduced Conduction and Commutation Losses", Power Electronics Institute, IEEE Xplore, vol. 8-1 (1999).

Liu et al., "Evaluation of Power Losses in Different CCM Mode Single-Phase Boost PFC Converters Via a Simulation Tool", Center for Power Electronics Systems, Virginia Polytechnic Institute & State University, IEEE Xplore (2001).

Salmon, John C., Ph.D., "Circuit Topologies for PWM Boost Rectifiers Operated from 1-Phase and 3-Phase AC Supplies and Using Either Single or Split DC Rail Voltage Outputs", Department of Electrical Engineering, University of Alberta, Canada, IEEE Xplore (1995).

Huber et al., "Performance Evaluation of Bridgeless PFC Boost Rectifiers", IEEE Transactions on Power Electronics, vol. 23, No. 3 (May 2008).

Chinese First Office Action, Chinese Application No. 200980132255.0, Jan. 21, 2013, 19 pages.

PCT International Search Report, PCT Application No. PCT/CN2009/073355, Nov. 26, 2009, 3 pages.

PCT Written Opinion, PCT Application No. PCT/CN2009/073355, Nov. 26, 2009, 4 pages.

European Extended Search Report, European Application No. 09807881.9, Apr. 12, 2013, 9 pages.

United States Office Action, U.S. Appl. No. 12/194,921, Jul. 18, 2013, 12 pages.

United States Office Action, U.S. Appl. No. 12/194,921, Jan. 3, 2014, 11 pages.

United States Office Action, U.S. Appl. No. 12/194,921, Apr. 7, 2011, 13 pages.

United States Office Action, U.S. Appl. No. 12/194,921, Nov. 29, 2011, 12 pages.

PCT International Search Report, PCT Application No. PCT/CN2009/073349, Nov. 26, 2009, 3 pages.

PCT International Written Opinion, PCT Application No. PCT/CN2009/073349, Nov. 26, 2009, 3 pages.

* cited by examiner

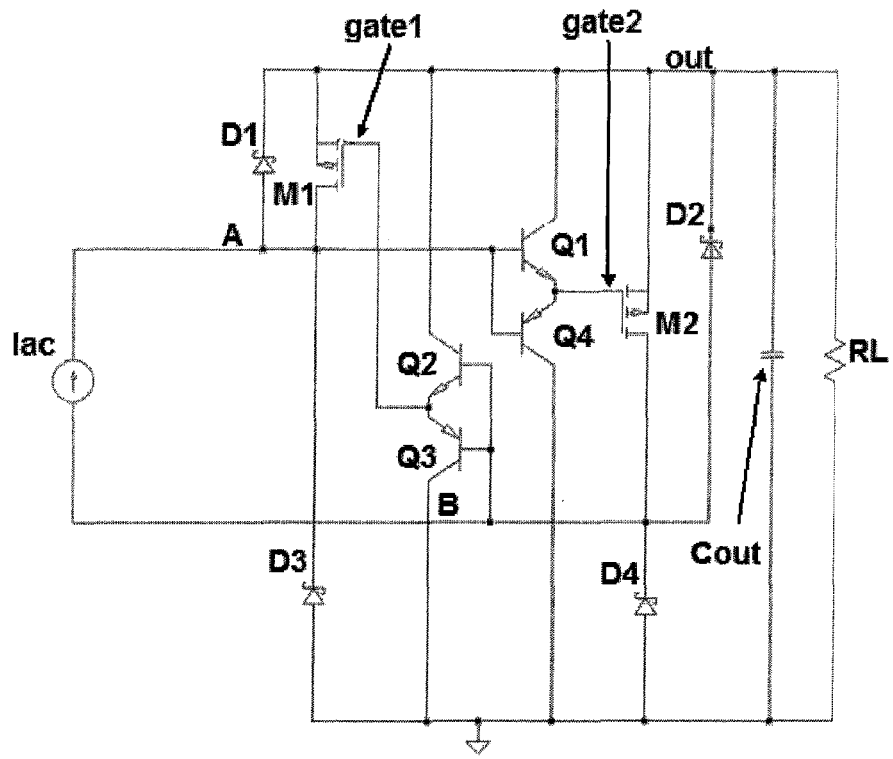
Fig. 11
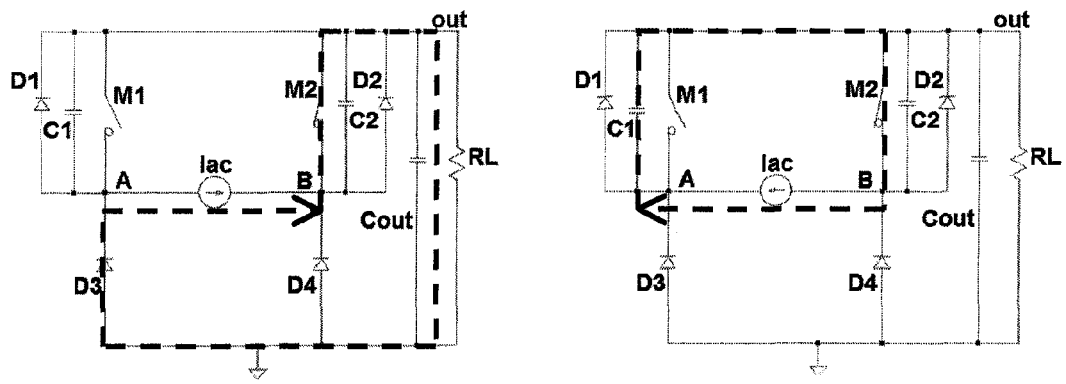
Fig. 12(a) t0 < t < t1     Fig. 12(b) t1 < t < t2

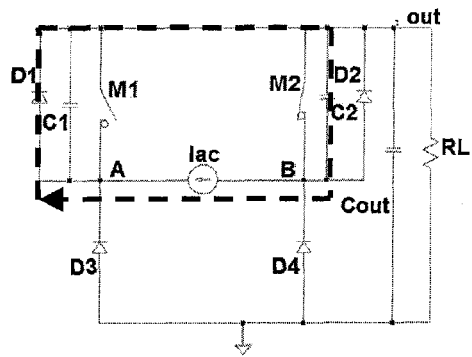
Fig. 12(c) t2 < t < t3
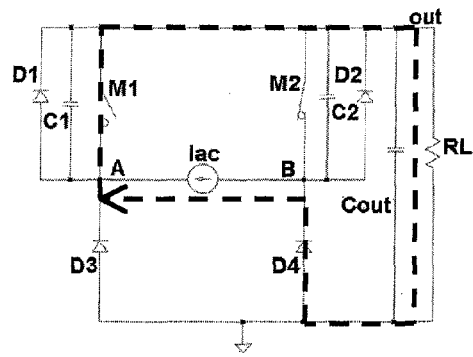
Fig. 12(d) t3 < t < t4
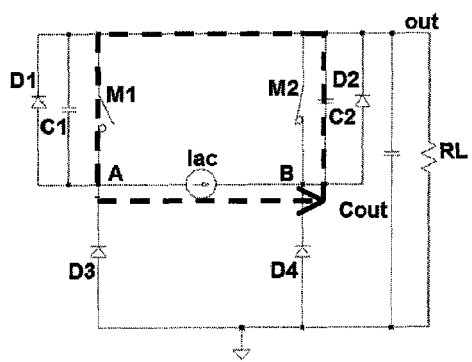
Fig. 12(e) t4 < t < t5
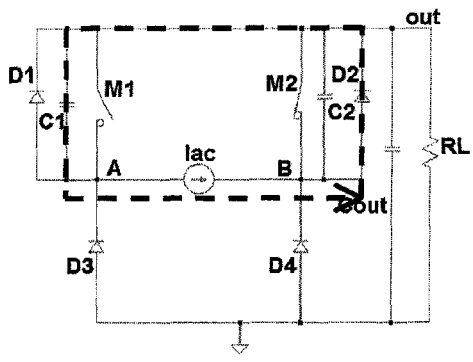
Fig. 12(f) t5 < t < t6

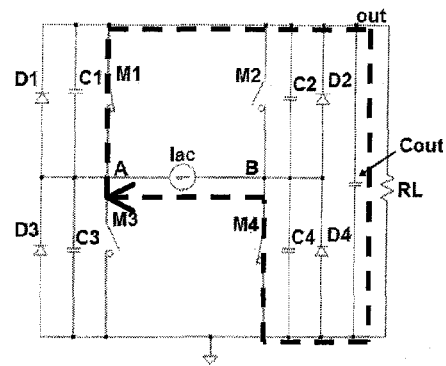 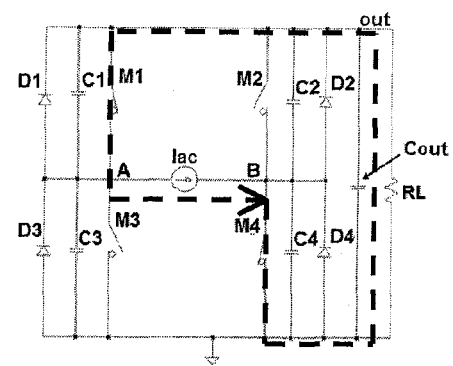
Fig. 16(a) t0 < t < t1    Fig. 16(b) t1 < t < t2
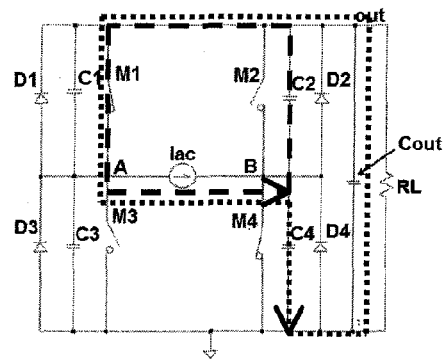 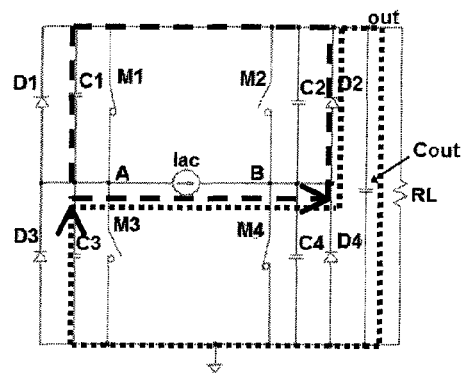
Fig. 16(c) t2 < t < t3    Fig. 16(d) t3 < t < t4
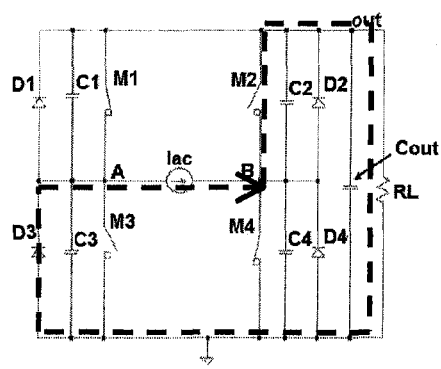 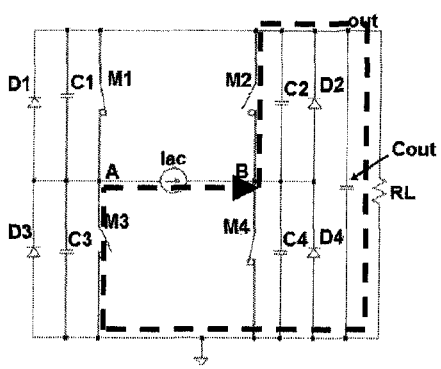
Fig. 16(e) t4 < t < t5    Fig. 16(f) t5 < t < t6

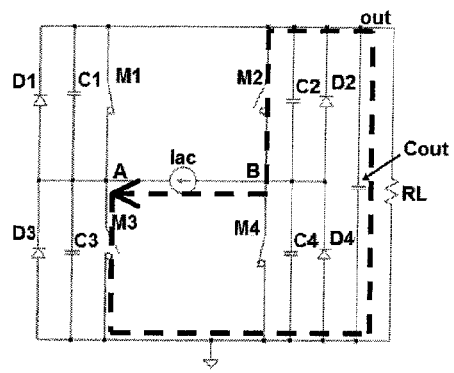
Fig. 16(g) t6 < t < t7
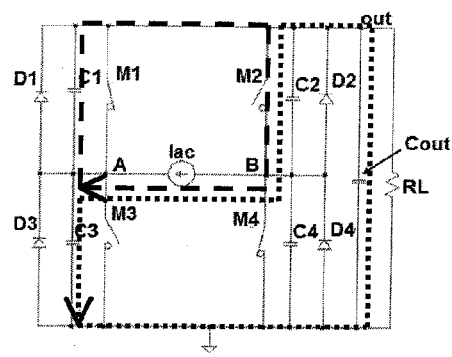
Fig. 16(h) t7 < t < t8
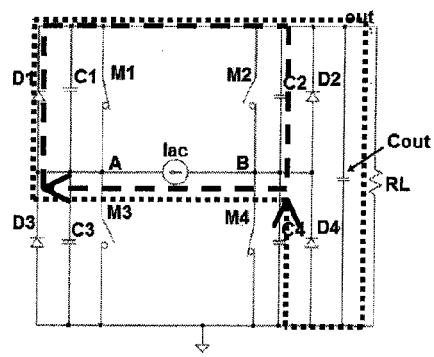
Fig. 16(i) t8 < t < t9
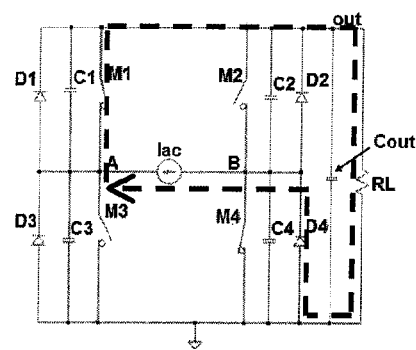
Fig. 16(j) t9 < t < t10

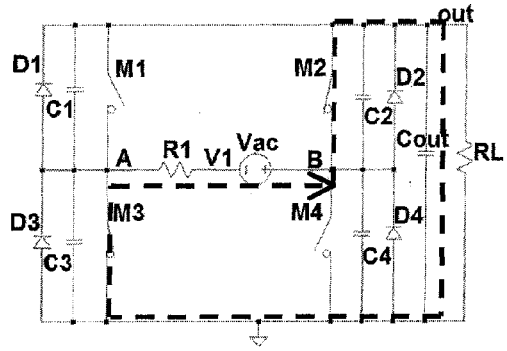 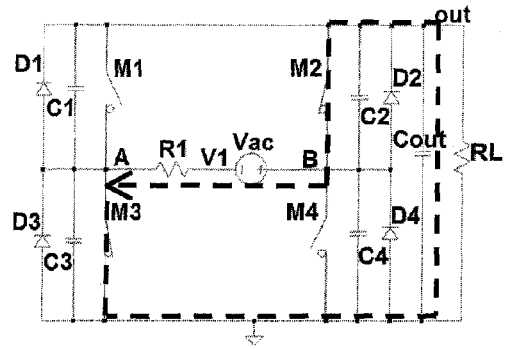
Fig. 20(a) t0 < t < t1     Fig. 20(b) t1 < t < t2
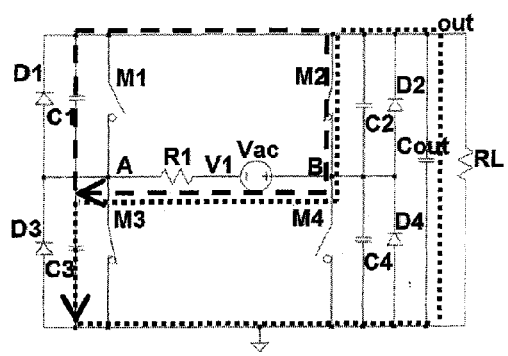 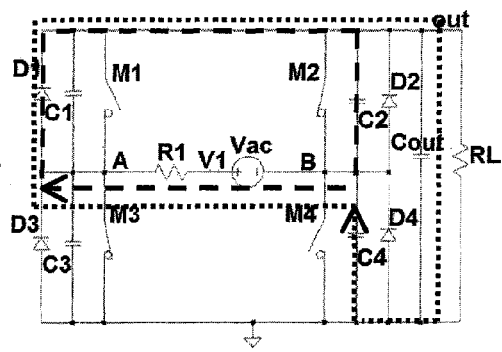
Fig. 20(c) t2 < t < t3     Fig. 20(d) t3 < t < t4
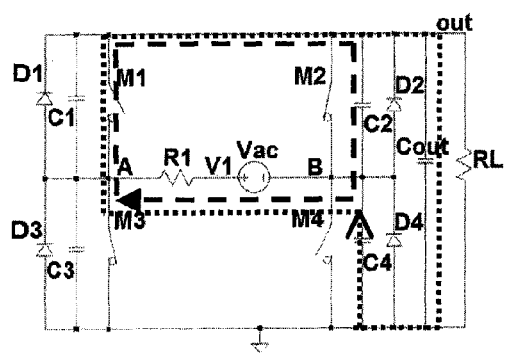 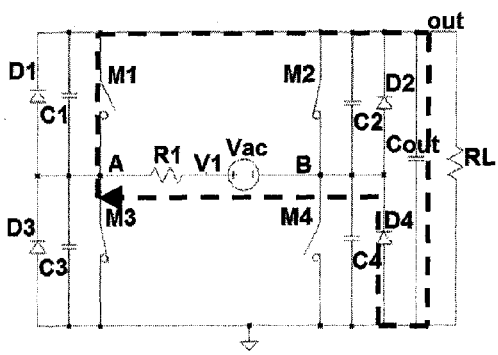
Fig. 20(e) t4 < t < t5     Fig. 20(f) t5 < t < t6

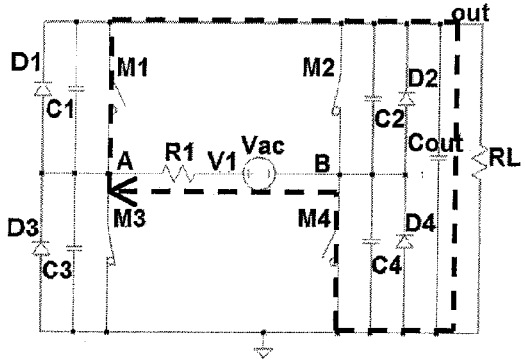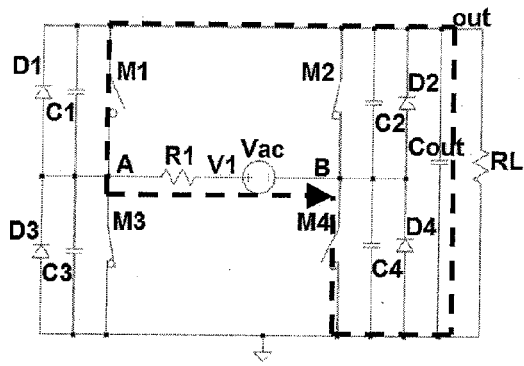
Fig. 20(g) t6 < t < t7    Fig. 20(h) t7 < t < t8
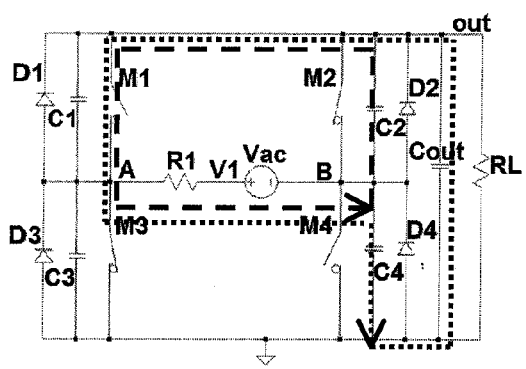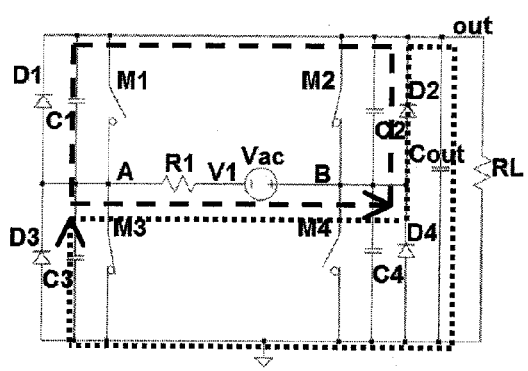
Fig. 20(i) t8 < t < t9    Fig. 20(j) t9 < t < t10
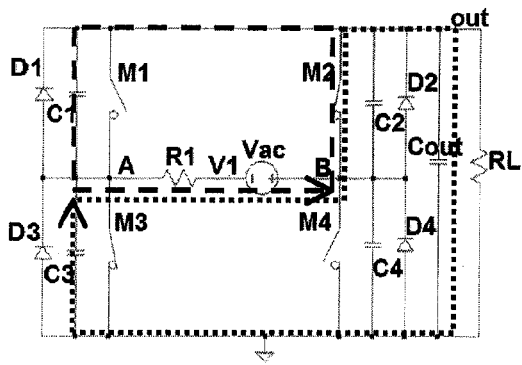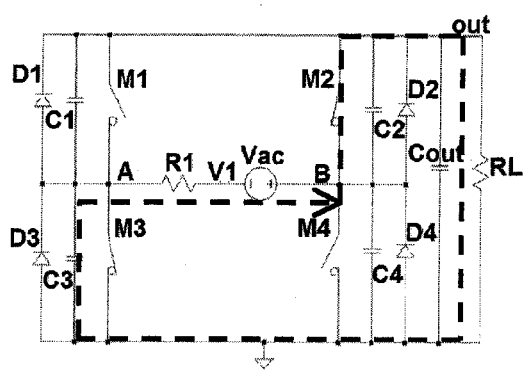
Fig. 20(k) t10 < t < t11    Fig. 20(l) t11 < t < t12

GENERALIZED AC-DC SYNCHRONOUS RECTIFICATION TECHNIQUES FOR SINGLE- AND MULTI-PHASE SYSTEMS

CROSS-REFERENCE TO RELATED APPLICATION

This application is a Continuation-In-Part (CIP) application of co-pending U.S. patent application Ser. No. 12/194,921, filed Aug. 20, 2008, entitled "Single-Phase Self-Driven Full Bridge Synchronous Rectification", which is hereby incorporated herein by reference in its entirety.

FIELD OF THE INVENTION

The present invention relates to methods and circuits for self-driven half- and full-bridge synchronous rectification, and in particular to generalized synchronous rectification techniques for single-phase to multi-phase, and to multi-level AC-to-DC power conversion.

BACKGROUND OF THE INVENTION

The conduction loss of a diode rectifier contributes significantly to the overall power loss in a power supply, especially in low out-voltage applications. The rectifier conduction loss is the product of its forward-voltage drop, VF, and the forward conduction current IF. FIG. 1(a) shows one kind of rectifier circuit known as a 'current doubler'. Even when a low forward-voltage drop Schottky diode is used, the voltage drop across D1 or D2 (normally 0.3-0.4V) is still significant in comparison to the low output voltage (e.g. equal to or less than 5V). If the current through the diode is 1A, the power loss from the diode is about 0.3 W-0.4 W, which is considerable, compared to the output power, e.g. 5 W.

One solution known in the prior art is 'synchronous rectification' (SR), i.e. using a low conduction loss active switch, such as a MOSFET, operating in the III quadrant to replace the diode. A n-channel (n-type) quadrant III MOSFET means that the source terminal is connected to a higher voltage than the drain terminal and current flows from source to drain. A p-channel (p-type) quadrant III MOSFET means that the drain terminal is connected to a higher voltage than the source terminal and current flows from drain to source. The internal resistance of a MOSFET during conduction is normally very low, which consequently reduces the rectifier conduction loss. FIG. 1(b) is a simple schematic of self-driven SR applied to a current doubler. The gate drive scheme of the MOSFET is to cross-couple the drive to the input AC voltage.

The prior art describes self-driven SR applied to a Forward rectifier (e.g. reference J. Blanc, S, Inc, Santa Clara, Calif., "Practical application of MOSFET synchronous rectifiers", Telecommunications Energy Conference, 1991. INTELEC'91, 1991, U.S. Pat. No. 6,038,138, entitled "Self-driven synchronous rectification scheme", N. Murakami, H Namiki, K Sakakibara, T Yachi, "A Simple and Efficient Synchronous Rectifier for Forward DC-DC Converters", Applied Power Electronics Conference and Exposition, 1993, U.S. Pat. Nos. 5,625,541 and 5,872,705, entitled "Low loss synchronous rectifier for application to clamped-mode power converters", U.S. Pat. No. 6,288,920, entitled "Drive compensation circuit for synchronous rectifier and method of operating the same", W A Tabisz, F C Lee, D Y Chen, "A MOSFET resonant synchronous rectifier for high-frequency DC/DC converters", Power Electronics Specialists Conference, 1990. PESC'90 . . . , 1990), self-driven SR applied to a Center-tap rectifier (e.g. reference U.S. Pat. No. 6,011,703, entitled "Self-synchronized gate drive for power converter employing self-driven synchronous rectifier and method of operation thereof", U.S. Pat. No. 6,583,993, entitled "Self-driven synchronous rectification scheme for wide output range"), self-driven SR applied to a Current doubler (e.g. reference U.S. Pat. No. 6,069,799, entitled "Self-synchronized drive circuit for a synchronous rectifier in a clamped-mode power converter"), SR with an auxiliary winding applied to a Forward rectifier (e.g. reference "X. Xie, J C P Liu, F N K Poon, M H Pong, "A novel high frequency current-driven synchronous rectifier applicable to most switching topologies", Power Electronics, IEEE Transactions on, 2001, P. Alou, J A. Cobos, O. Garcia, R. Prieto, J. Uceda, "A new driving scheme for synchronous rectifiers: single winding self-driven synchronous rectification", Power Electronics, IEEE Transactions on, 2001, U.S. Pat. No. 6,301,139, entitled "Self-driven synchronous rectifier circuit for non-optimal reset secondary voltage"), SR with an auxiliary winding applied to a Center-tap rectifier (e.g. reference "X. Xie, J C P Liu, F N K Poon, M H Pong, "A novel high frequency current-driven synchronous rectifier applicable to most switching topologies", Power Electronics, IEEE Transactions on, 2001, P. Alou, J A. Cobos, O. Garcia, R. Prieto, J. Uceda, "A new driving scheme for synchronous rectifiers: single winding self-driven synchronous rectification", Power Electronics, IEEE Transactions on, 2001, A. Fernandez, J. Sebastian, M M Hernando, P J Villegas and Jorge Garcia, "New self-driven synchronous rectification system for converters with a symmetrically driven transformer", Industry Applications, IEEE Transactions on, 2005, T. Qian, W. Song, B. Lehman, "Self-Driven Synchronous Rectification Scheme Without Undesired Gate-Voltage Discharge for DC-DC Converters With Symmetrically Driven Transformers", Power Electronics, IEEE Transactions on, 2008), SR with an auxiliary winding applied to a Current doubler (e.g. reference "X. Xie, J C P Liu, F N K Poon, M H Pong, "A novel high frequency current-driven synchronous rectifier applicable to most switching topologies", Power Electronics, IEEE Transactions on, 2001, P. Alou, J A. Cobos, O. Garcia, R. Prieto, J. Uceda, "A new driving scheme for synchronous rectifiers: single winding self-driven synchronous rectification", Power Electronics, IEEE Transactions on, 2001, Y. Panov, M M Jovanovic, "Design and performance evaluation of low-voltage/high-current DC/DC on-board modules", Applied Power Electronics Conference and Exposition, 1999 . . . , 1999), external controlled SR applied to a Forward rectifier (e.g. reference C. Blake, D. Kinzer, P. Wood, "Synchronous Rectifiers versus Schottky Diodes: A Comparison of the Losses of a Synchronous Rectifier versus the Losses of a Schottky Diode Rectifier", IEEE Applied Power Electronics Conference (APEC), 1994, M M Jovanovic, M T Zhang, F C Lee, "Evaluation of synchronous-rectification efficiency improvement limits in forward converters", Industrial Electronics, IEEE Transactions on, 1995), external controlled SR applied to a Current doubler (e.g. reference H J Chiu, L W Lin, "A high-efficiency soft-switched AC/DC converter with current-doubler synchronous rectification", Industrial Electronics, IEEE Transactions on, 2005, U.S. Pat. No. 6,240,318, entitled "Transcutaneous energy transmission system with full wave Class E rectifier") and external controlled SR applied to a Flyback rectifier (e.g. reference M T Zhang, M M Jovanovic, F C Y Lee, "Design considerations and performance evaluations of synchronous rectification in flyback converters", Power Electronics, IEEE Transactions on, 1998).

In the above examples of the prior art, self-driven SR is the simplest, compared to the auxiliary winding version and the external controlled version, because no extra winding or extra controller is needed. From a review of the prior art, however, it can be seen that to date there has been no successful attempt to provide self-driven full-bridge SR. A full-bridge rectifier is an important rectifier circuit which has wide applications. A typical single-phase full-bridge rectifier is shown in FIGS. 2(a) and (b). The AC input can be a current source or a voltage source. In the first half cycle as shown in FIG. 2(a), current flows through the input, diode D1, the load and diode D4, which is called a current loop. When the current direction reverses, diode D1 and D4 turn off automatically. Current then flows through the input, diode D2, the load and diode D3, as shown in FIG. 2(b), which is another current loop. It should be noted that the automatic turn-off property of a diode is critical to the normal operation of the circuit. A practical self-driven full-bridge SR must therefore have a mechanism for sensing the reverse current for turning off the appropriate switches.

By extending the existing self-driven SR which has been applied to other rectifiers (like the one in FIG. 1(b)), one may derive a straightforward self-driven full-bridge SR circuit, as shown in FIG. 3(a), in which four diodes are replaced by two p-type MOSFETs, M1 and M2, and two n-type MOSFETs, M3 and M4. M1 and M3 are driven by sensing the voltage of point B, while M2 and M4 are driven by sensing the voltage of point A. Such an approach is called 'voltage controlled self-driven' (VCSD) because the driving signal is coupled to voltage. However, there is a defect in this circuit, As shown in FIG. 3(b), the current loop through M1 and M4 can flow in both directions, because VCSD gate drive cannot detect the reverse current. The current can also flow in both directions in the loop through M2 and M3. Unlike the diodes in FIG. 2, which can automatically turn off when their current reverses, such switches with a bi-directional switch current flow can make the commutation fail.

Since n-type power MOSFETs have lower on-state resistance than p-type MOSFETs, for high current applications, the two p-type MOSFETS mentioned previously can also be replaced by 2 n-type MOSFETS, provided that an extra inversion stage is added in the gate drive circuit as shown in FIG. 4 in order to preserve the "self-driven" feature which is based on detecting the input ac power source.

Some prior art has dealt with full-bridge SR with other approaches (e.g. Reference: U.S. Pat. No. 7,269,038, entitled "VRMs and Rectified Current Sense Full-Bridge Synchronous-Rectification Integrated with PFC"; U.S. Patent Application Publication No. US 2007/0029965 A1, entitled "Rechargeable Battery Circuit and Structure for Compatibility with a Planar Inductive Charging Platform"; U.S. Pat. No. 4,412,277, entitled "AC-DE Converter Having an Improved Power Factor"; A F Souza & I. Barbi, "High Power Factor Rectifier with Reduced Conduction and Commutation Losses", International Telecommunication Energy Conf. (INELEC), June 1999; J. Liu, W. Chen, J. Zhang, D Xu, and F. C. Lee, "Evaluation of Power Losses in Different CCM Mode Single-Phase Boost PFC Converters Via Simulation Tool", Industry Applications Conf. (IAS), September 2001; J. C. Salmon, "Circuit Topologies for PWM Boost Rectifiers Operated from 1-Phase and 3-Phase AC Supplies and Using Either Single or Split DC Rail Voltage Outputs", Applied Power Electronics (APEC), March 1995; and L. Huber, Y. Jang, M. Jovanovic, "Performance Evaluation of Bridgeless PFC Boost Rectifiers", Power Electronics, IEEE Transactions on, May 2008), employing an external controller that is suitable for the application of PFC (Power Factor Correction). Also known in the prior art is H. Miura, S. Arai, F. Sato, H. Matsuki & T. Sato, "A Synchronous Rectification Using a Digital PLL Technique for Contactless Power Supplies", Magnetics, IEEE Transactions on, 2005, but that proposal needs the help of a resonant capacitor at the secondary winding creating a sinusoidal voltage waveform and a smoothing inductor at the output to enhance the turn-off timing. But the passive capacitor and inductor are large in size and this inevitably creates a large dead-time between the driving pulses that adversely affects the duration of power transfer in one cycle. This kind of approach has a major limitation. Eventually this approach has been changed to the use of an external digital PLL controlled SR to achieve miniaturisation. This is still not an example of self-driven full-bridge SR.

SUMMARY OF THE INVENTION

According to the present invention there is provided a half- or full-bridge rectifier configured to provide synchronous rectification with either a current-source or a voltage-source, said rectifier comprising an upper branch and a lower branch and at least two current loops, each said branch comprising voltage- or current-controlled active switches, inductors, diodes or combinations thereof selected such that each said loop includes one active switch, inductor or diode from said upper branch and one active switch, inductor or diode from said lower branch, and wherein each said current loop comprises at least one diode, inductor or current-controlled active switch, and wherein at least one voltage- or current-controlled active switch is included in one of said upper or lower branches and with the proviso that no current loop may contain two inductors.

Preferably the voltage- and current-controlled active switches are self-driven and do not require external control signals. One examples for such a voltage-controlled active switch is one that is driven by an input ac voltage provided to said switch by a gate drive circuit. An example of a current-controlled active switch is one that is driven by sensing the current direction of the switch and providing a signal to a gate drive circuit dependent on the current direction. An active switch may comprise a power MOSFET or some other semiconductor switching device. A sensing resistor may be used for sensing the current direction, including the possibility that the internal resistance of the current-controlled active switch may be used for sensing the current direction.

The rectifier may be configured to receive a current source or a voltage source.

In one embodiment of the invention the upper branch comprises two voltage-controlled active switches and the lower branch comprises two current-controlled active switches, or one current-controlled switch and one diode, or two diodes.

In a further embodiment of the invention the upper branch comprises one voltage-controlled active switch and one current-controlled active switch or diode, and the lower branch comprises one voltage-controlled active switch and one current-controlled active switch or diode, wherein the current-controlled active switch(es) or diode(s) are not provided in the same current loop.

In a further embodiment of the invention the upper branch comprises one voltage-controlled active switch and one current-controlled active switch or diode, and the lower branch comprises two current-controlled active switches, or one current-controlled switch and one diode, or two diodes.

In a further embodiment of the invention the upper branch comprises two current-controlled active switches, or one current-controlled switch and one diode, or two diodes, and the lower branch comprises two voltage-controlled active switches.

In a further embodiment of the invention the upper branch comprises two current-controlled active switches, or one current-controlled switch and one diode, or two diodes, and the lower branch comprises one voltage-controlled active switch and one current-controlled switch or one diode.

In a further embodiment of the invention the rectifier comprises only current-controlled active switches and/or diodes in the upper and lower branches and wherein at least one of the branches includes at least one current-controlled active switch.

In another embodiment of the invention the rectifier is a half-bridge rectifier wherein the upper branch and the lower branch each comprises a capacitor and one of a current-controlled active switch, inductor or diode subject to the constraint that no more than one of the branches comprises a diode.

In another embodiment of the invention the rectifier is a three-phase full-bridge rectifier comprising an upper branch and a lower branch and six current loops, each branch comprising voltage- or current-controlled active switches, diodes or combinations thereof selected such that each loop includes one active switch or diode from the upper branch and one active switch or diode from the lower branch, and wherein each the current loop comprises at least one diode or current-controlled active switch, and wherein at least one voltage- or current-controlled active switch is included in one of said upper or lower branches.

In one form of this embodiment the upper branch comprises three current-controlled active switches or diodes. In another form of this embodiment the lower branch comprises three current-controlled active switches or diodes. In a further form of this embodiment the lower branch and the upper branch each comprise two current-controlled active switches or diodes, and each current loop comprises at least one current-controlled active switch or diode.

According to the invention there is also provided a multi-level rectifier wherein each level includes at least one circuit topology comprising an upper branch and a lower branch and two current loops, and wherein at least said circuit topology is configured such that each said branch comprises voltage- or current-controlled active switches, inductors, diodes or combinations thereof selected such that each said loop includes one active switch, inductor or diode from said upper branch and one active switch, inductor or diode from said lower branch, and wherein each said current loop comprises at least one diode, inductor or current-controlled active switch, and wherein at least one voltage- or current-controlled active switch is included in one of said upper or lower branches and with the proviso that no current loop may contain two inductors.

According to the invention there is still further provided a current doubler comprising an upper branch and a lower branch and two current loops wherein the upper branch comprises two inductors, and the lower branch comprises voltage- or current-controlled active switches, diodes or combinations thereof, and the lower branch comprises at least one voltage-controlled active switch or at least one current-controlled active switch.

Further, additional features and advantages are realized through the techniques of the present invention. Other embodiments and aspects of the invention are described in detail herein and are considered a part of the claimed invention.

BRIEF DESCRIPTION OF THE DRAWINGS

Some embodiments of the invention will now be described by way of example and with reference to the accompanying drawings, in which:

FIG. 11 is a circuit diagram showing a current-source input upper half VCSD full-bridge synchronous rectification circuit according to an embodiment of the present invention, FIGS. 12(a)-(f) show current flows in the circuit of FIG. 11, FIGS. 16(a)-(j) show current flows in the circuit of FIG. 15, FIGS. 20(a)-(l) show current flows in the circuit of FIG. 19.

DETAILED DESCRIPTION OF THE INVENTION

Figure 3A:
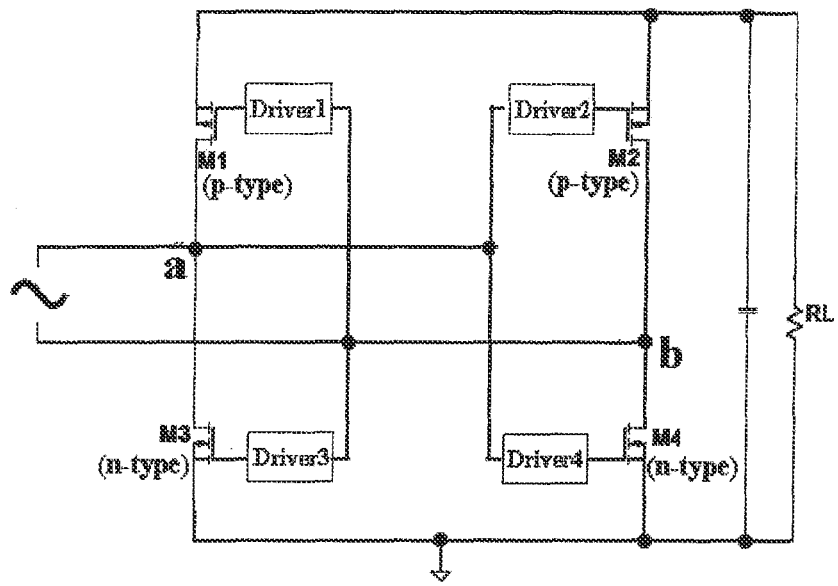
FIG. 3 is a diagram illustrating the problem of simply replacing the diodes with MOSFETs without sensing the reverse current.
Figure 3B:
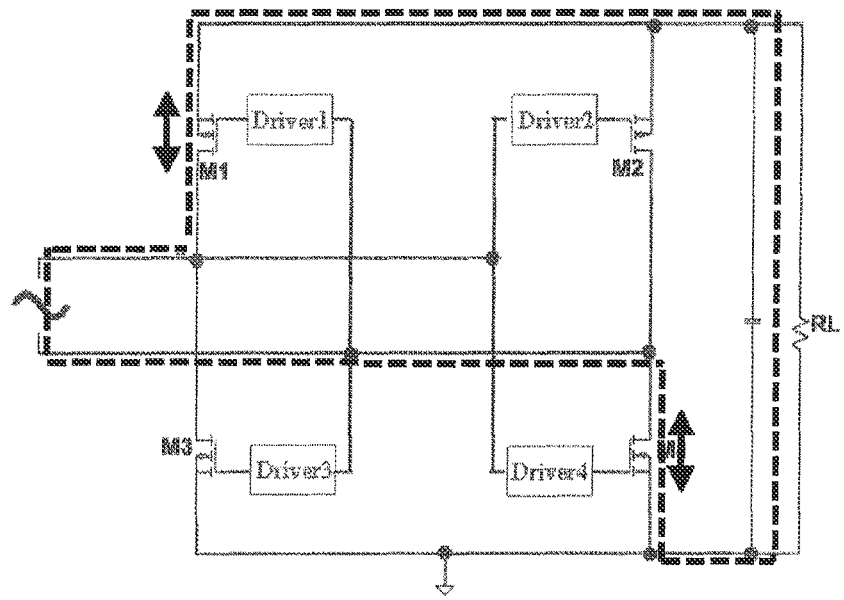
Figure 4:
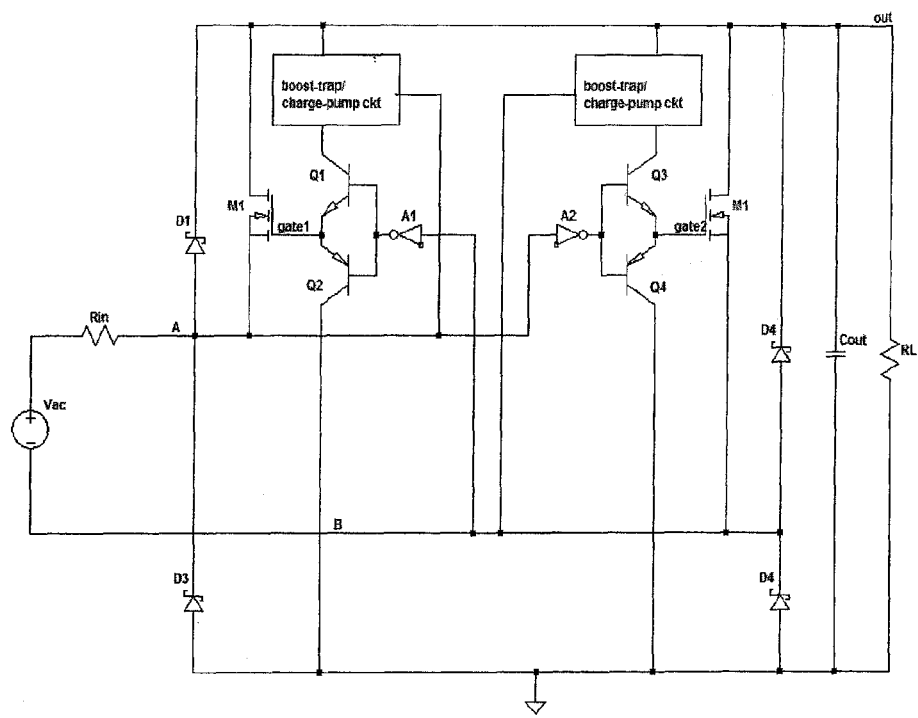
FIG. 4 is a self-driven full-bridge rectifier according to an embodiment of the invention using n-type MOSFETs as active switches at the upper branches.
Figure 5A:
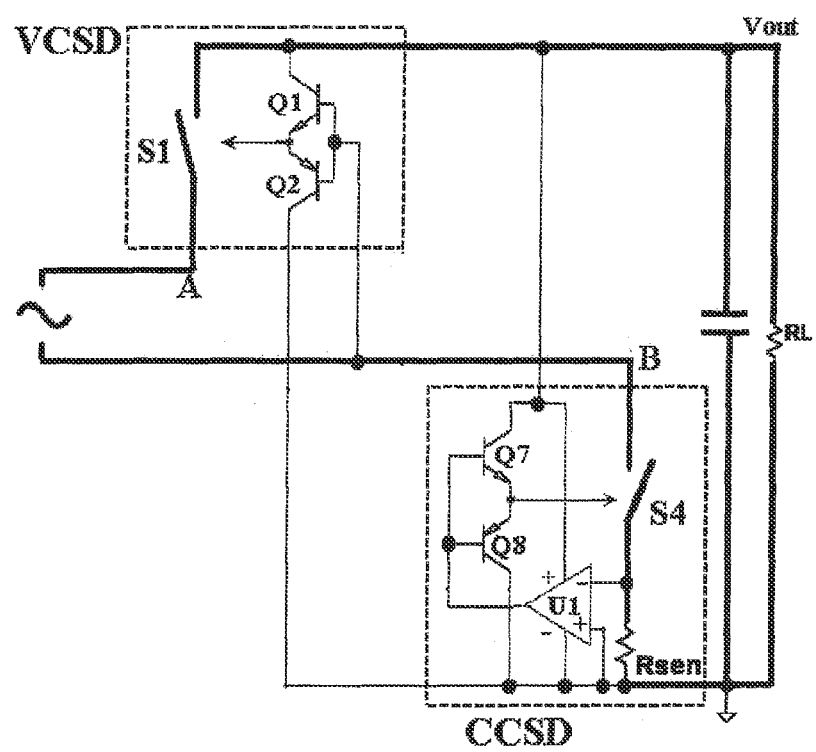
FIGS. 5(a)-(c) show respectively (a) an embodiment of one current loop and the implementation of VCSD and CCSD, (b) an embodiment of one current loop and a second alternate implementation of CCSD, and (c) an embodiment of one current loop and a third alternate implementation of CCSD.
Figure 5B:
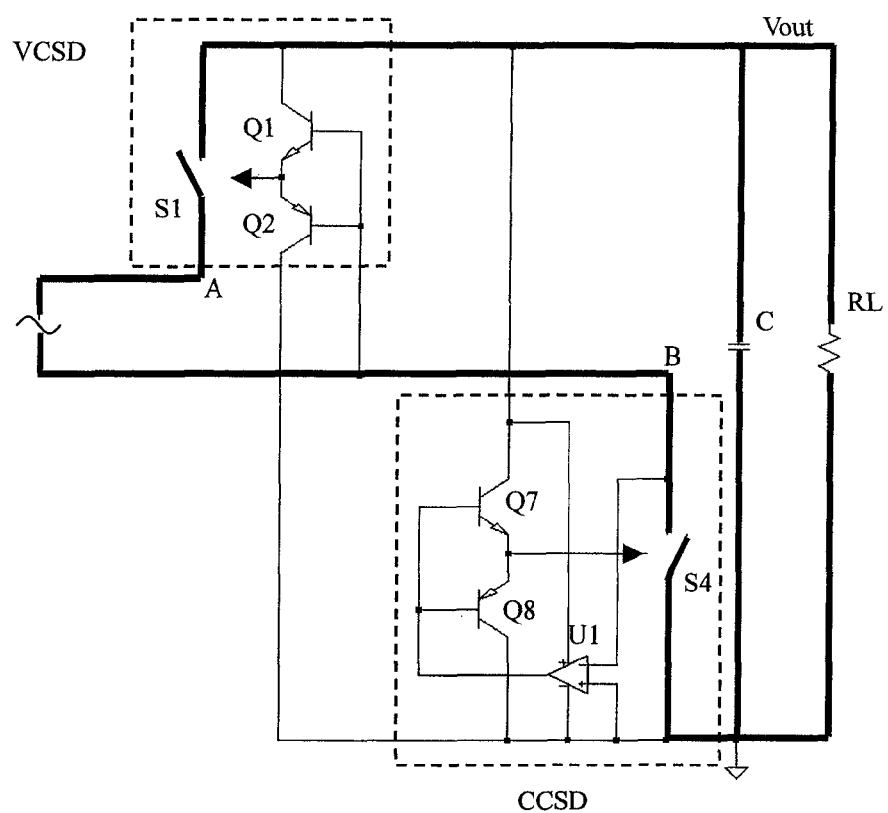
Figure 5C:
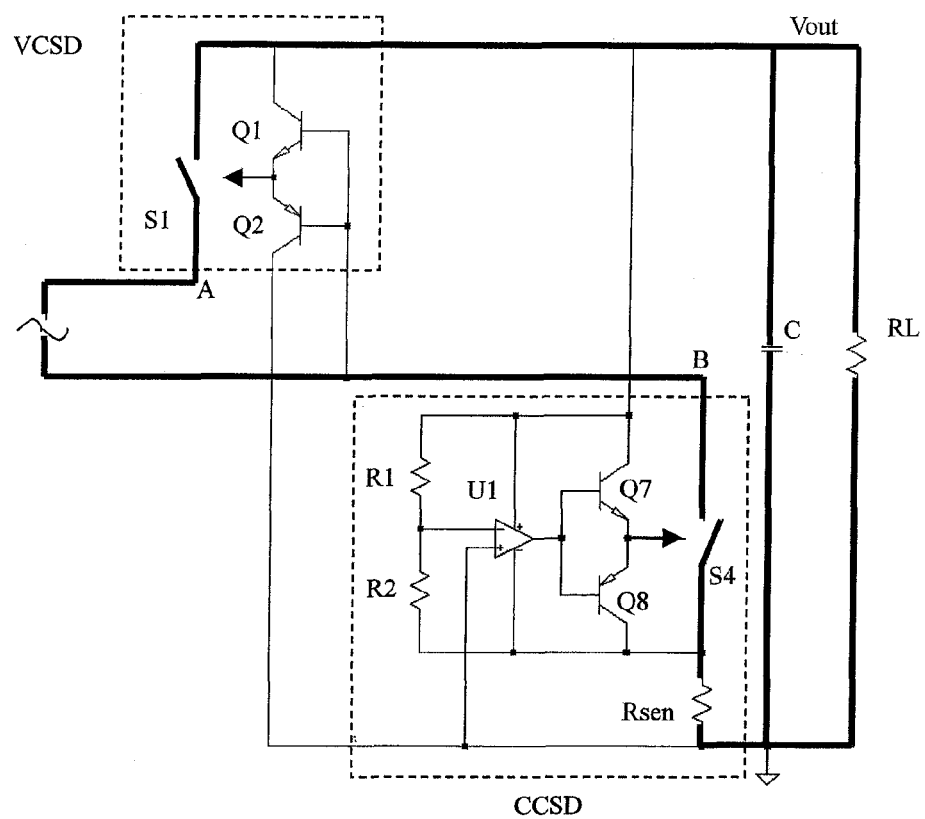

To solve the defect in the circuit shown in FIG. 3, a new principle is proposed as follows:

In any current loop (such as the one formed by M1 and M4 in FIG. 3(b)), there cannot exist two voltage controlled self-driven (VCSD) MOSFETs. At least one of the switches in each current loop must be either a diode, an active switch or other component with a similar property to a diode in that the active switch or other component will be turned off when its current is reversed. In FIGS. 5(a)-(c), for example, take only one current loop formed by S1 and S4 as an example. Suppose S1 is a VCSD active switch, then S4 must be either a diode or an active switch or some other component that has the capability of blocking current flow when the current reverses direction. In FIGS. 5(a) to (c), the implementation of the switches is also illustrated. S1 is a VCSD MOSFET that is driven by the complementary gate drive circuit formed by Q1 and Q2, and the input of this gate drive circuit is cross-connected to one input voltage terminal (Point B in this example). S4 can be a diode or an active switch. If it is an active switch, it must be controlled by sensing the current. Such an active switch may be termed a current-controlled self-driven (CCSD) active switch. As shown in FIG. 5(a), a sensing resistor Rsen is used to detect the current flow direction of S4. Comparator U1 can produce the driving pulses according to the current flow direction detected by Rsen. A positive current through S4 ('positive' is defined as current flow from ground to point B) will cause the output of comparator U1 to be high. The high voltage level of the comparator output, in turn, will drive the complementary gate drive circuit formed by Q7 and Q8. S4 is therefore turned ON according to its positive current flow direction and turned OFF in opposite manner. Both the VCSD and the CCSD active switches are self-driven in the sense that they do not require external control circuitry.

FIG. 5(b) shows a second alternate implementation of CCSD active switch. As shown in FIG. 5(b), the previous resistor Rsen shown in FIG. 5(a) has been removed. This CCSD active switch uses its internal resistance to detect the current flow direction. The comparator U1 can still produce the driving pulses according to the current flow direction detected by the internal active switch resistance. The driving pulse control mechanism for Q7 and Q8 is still the same as those in FIG. 5(a). The advantage of this CCSD active switch is to eliminate the use of a sensing resistor. However, the drawback is that it may not be suitable for high voltage rectification as too high voltage at the sensing pin of comparator U1 would be inadequate.

FIG. 5(c) shows a third alternate implementation of CCSD active switch. This CCSD active switch uses resistor Rsen for detecting the current flow direction of S4. However, the comparator U1 uses its non-inverting pin as the current sense detection pin. A voltage bias or level-shift voltage at the inverting pin, along with comparator's ground, being with reference to the "Source" of S4 (e.g. MOSFET acting as the active switch), is added. The positive current flow through S4 is detected by comparator U1 with the help of resistor Rsen. Positive driving pulse is then produced and the pulse control mechanism of Q7 and Q8 is preserved as shown in FIG. 5(a). The addition of a bias voltage has reduced the turn-off delay time when reverse current occurring at the switch S4.

Before introducing detailed descriptions of application examples, a generalization of AC-DC synchronous rectification technique for single-phase, multi-phase systems will be shown in order to illustrate the usefulness of the proposed circuit for utility power line rectification, three-phase (or multi-phase) and multi-level systems. Circuits and principles of some applications are given as examples, in which the self-driven full-bridge SR has been implemented in the following embodiments.

Since there are many possible combinations of using CCSD, VCSD and diode in a rectification system, it is necessary to systematically identify the valid configurations, regardless of how many phases and how many levels the AC-DC rectifier system has. FIG. 3 shows one of the invalid SR configurations which has the problem of not blocking reverse current in a current loop of a rectifier. It is necessary to identify all valid SR circuits which are practical. In this specification example of single-phase, three-phase and multi-level self-driven full-bridge synchronous rectifications are shown, and a systematic way of SR identification is proposed and all possible SR circuits in rectification system will be tabulated accordingly.

A systematic way of generalizing an AC-DC self-driven synchronous rectification system is shown as follows.

The locations of upper branch elements in a rectifier are defined as:

$X_i = 1 \ldots n$

The locations of lower branch elements in a rectifier are defined as:

$$X_j |_{\substack{k=1 \ldots n \\ j \neq i+n}} = k + n$$

The circuit element (which can be an active switch, a diode, or other circuit element) in the upper branch is defined as:

$SX_i$

The circuit element in the lower branch is defined as, $SX_j$ where X represents the type of circuit element in the branch.

A current-controlled self-driven (CCSD) active switch, a diode and an inductor have been associated with a logic value of "1". These types of circuit element show the capability of resisting instantaneous current change (while not being a switch in the conventional sense an inductor can function successfully in embodiments of this invention as if it were a CCSD active switch as it is capable of resisting an instantaneous change in current direction—however it should be noted that a current loop comprising two inductors would not function). A voltage-controlled self-driven (VCSD) active switch and a capacitor have no such capability of resisting instantaneous current change. Therefore, they have been assigned a logic value of "0". Table 1 shows the corresponding logic value for each circuit element.

TABLE 1

Logic assignments of different circuit elements

| X | CCSD<br>I | Diode<br>D | Inductor<br>L | VCSD<br>V | capacitor<br>C |
|---|---|---|---|---|---|
| SX | 1 | 1 | 1 | 0 | 0 |

In a bridge rectifier each current loop $\{X_i, X_j\}$ can be identified by the branch location in the circuit and an associated circuit element in the branch can be mapped in the corresponding current loop.

$\{X_i, X_j\} \rightarrow \{SX_i, SX_j\}$

In order to achieve the function of self-driven synchronous rectification in a rectifier it requires that at least one CCSD active switch, inductor or diode must be present in each current loop of a rectifier. The above circuit elements have the capability of blocking a reverse current flow and changing to OFF state automatically. Therefore, the logical "OR" function of two circuit elements in a current loop must be equal to "1" such that the self-driven synchronous rectification mechanism can be realized in a transition period of FIG. 5.

It will therefore be understood that in the following analysis of the different possible configurations the following terminology is used;

$SX_i \cup SX_j = 1$ means that a correct combination of circuit elements exist in a current loop.

Or else, an invalid combination of circuit elements will be present $SX_i \cup SX_j = 0$ means that an incorrect combination of circuit elements exist in a current loop.

Figure 6:
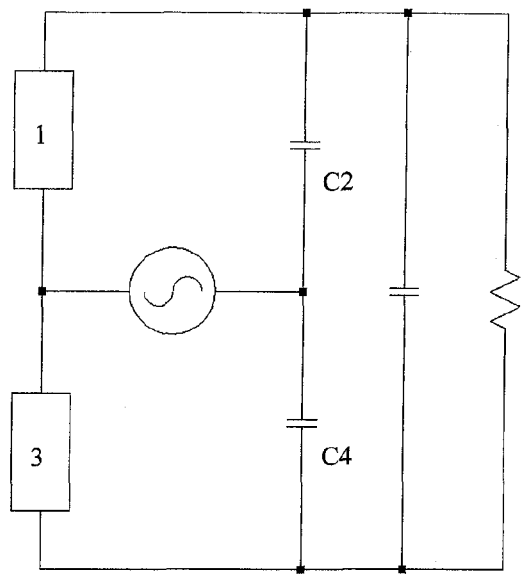
FIG. 6 is a block diagram showing branch locations in a full-bridge rectifier system according to an embodiment of the invention.

Different types of circuit topologies which can contribute to the formation of an AC-DC self-driven synchronous rectification system are shown in the following figures, beginning with reference to FIG. 6 and Table 1 which define the topology of a full-bridge rectifier and the associated current loops where the upper branch comprises circuit elements 1 and 2, while the lower branch comprises circuit elements 3 and 4.

TABLE 1

Validations of a single-phase full bridge SR

| | branch position | | | | | | Valid SR |
| | 1 | 2 | 3 | 4 | A | B | Config. |
| | | | | Circuit element | | | |
| Config. # | $SX_1$ | $SX_2$ | $SX_3$ | $SX_4$ | $SX_1 \cup SX_4$ | $SX_2 \cup SX_3$ | $A \cap B$ |
| 1 | 0 | 0 | 1 | 1 | 1 | 1 | 1 |
| 2 | 0 | 1 | 0 | 1 | 1 | 1 | 1 |
| 3 | 0 | 1 | 1 | 1 | 1 | 1 | 1 |
| 4 | 1 | 0 | 1 | 0 | 1 | 1 | 1 |
| 5 | 1 | 0 | 1 | 1 | 1 | 1 | 1 |
| 6 | 1 | 1 | 0 | 0 | 1 | 1 | 1 |
| 7 | 1 | 1 | 0 | 1 | 1 | 1 | 1 |
| 8 | 1 | 1 | 1 | 0 | 1 | 1 | 1 |
| 9 | 1 | 1 | 1 | 1 | 1 | 1 | 1 |

There are 9 out of 16 valid configurations which have the function of self-driven synchronous rectification in the single-phase AC-DC full-bridge system.

Figure 7:
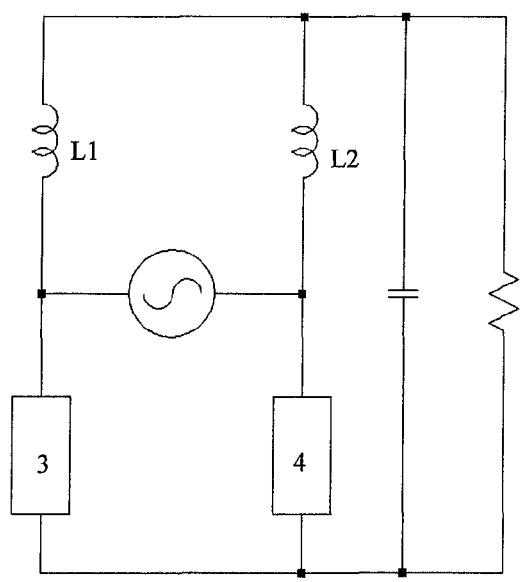
FIG. 7 is a block diagram showing branch locations in a half-bridge rectifier or voltage doubler system according to an embodiment of the invention.

FIG. 7 and Table 2 illustrate the possible configurations for a half-bridge rectifier or voltage doubler, again with associated current loops $\{1, 4\}$, $\{2, 3\}$ where the upper branch comprises circuit elements 1 and 2, and the lower branch comprises circuit elements 3 and 4.

TABLE 2

Validations of a single-phase half-bridge rectifier or voltage doublers

| | branch position | | | | | | Valid SR |
| | 1 | 2 | 3 | 4 | A | B | Config. |
| | | | | Circuit element | | | |
| Config. # | $SX_1$ | $SX_2$ | $SX_3$ | $SX_4$ | $SX_1 \cup SX_4$ | $SX_2 \cup SX_3$ | $A \cap B$ |
| 1 | 1 | 0 | 1 | 0 | 1 | 1 | 1 |

There is 1 out of 4 valid configurations which has the function of self-driven synchronous rectification in the single-phase AC-DC half-bridge or voltage doubler system.

Figure 8:
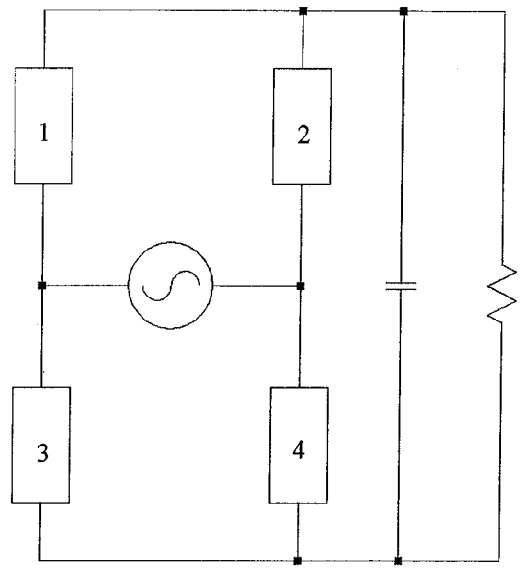
FIG. 8 is a block diagram showing branch locations in a current doubler system according to an embodiment of the invention.

FIG. 8 and Table 3 consider the situation of a current doubler with current loops $\{1, 4\}$, $\{2, 3\}$ where the upper branch comprises circuit elements 1 and 2, and the lower branch comprises circuit elements 3 and 4, though in the case of the current doubler the upper branch, ie circuit elements 1 and 2, must comprise inductors L1 and L2.

TABLE 3

Validations of single-phase current doublers

| Config. # | branch position | | | | Circuit element | | Valid SR Config. |
|---|---|---|---|---|---|---|---|
| | 1 | 2 | 3 | 4 | A | B | |
| | $SX_1$ | $SX_2$ | $SX_3$ | $SX_4$ | $SX_1 \cup SX_4$ | $SX_2 \cup SX_3$ | $A \cap B$ |
| 1 | 1 | 1 | 0 | 0 | 1 | 1 | 1 |
| 2 | 1 | 1 | 0 | 1 | 1 | 1 | 1 |
| 3 | 1 | 1 | 1 | 0 | 1 | 1 | 1 |
| 4 | 1 | 1 | 1 | 1 | 1 | 1 | 1 |

There are 4 out of 4 valid configurations which have the function of self-driven synchronous rectification in the single-phase AC-DC current doublers system.

Figure 9:
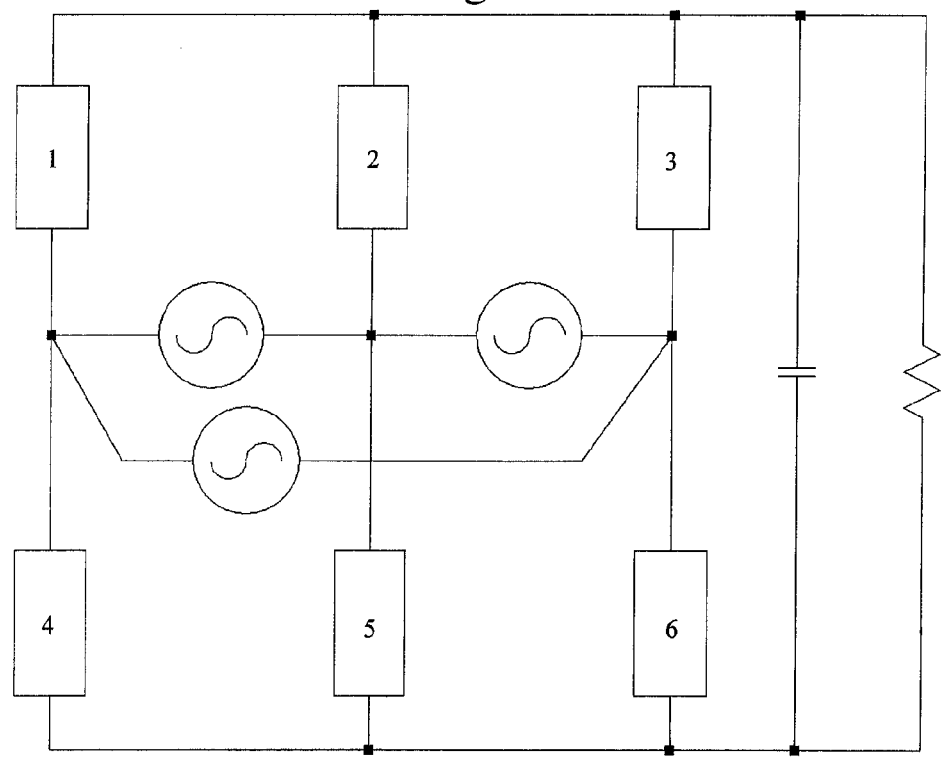
FIG. 9 is a block diagram showing branch locations in a three-phase rectifier system according to an embodiment of the invention.

FIG. 9 and Table 4 considers a three-phase full-bridge rectifier with an upper branch comprising three circuit elements 1, 2 and 3, and a lower branch comprising three circuit elements 4, 5 and 6, with six associated current loops {1,5},{1,6},{2,4},{2,6},{3,4},{3,5}.

From Table 4 it can be seen that there are 17 out of 56 valid configurations which have the function of self-driven synchronous rectification in the three-phase AC-DC rectifier system.

Figure 10:
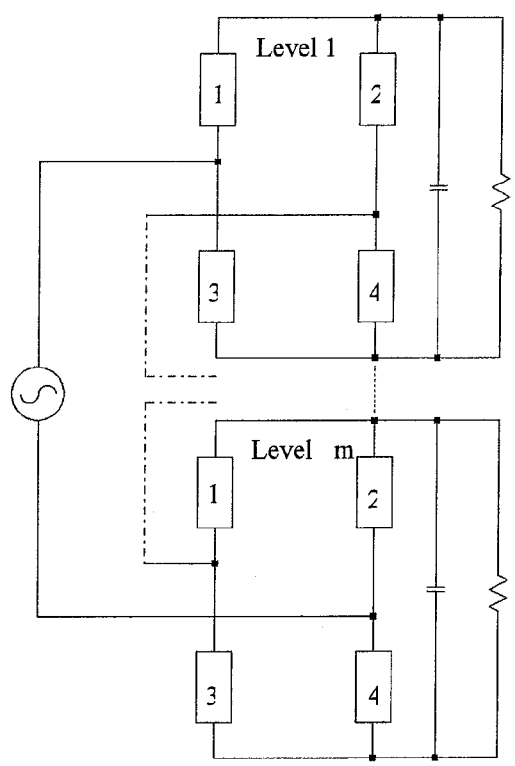
FIG. 10 is a block diagram showing branch locations in a multi-level cascaded full-bridge rectifier system according to an embodiment of the invention.

FIG. 10 and Table 6 considers a multi-level single-phase full-bridge rectifier system. In this example the topology is that of a multi-level cascaded topology with two levels, but it will be understood that other configurations are possible. In this example each level has two associated current loops The current flow in level 1 is independent of that in level m; therefore, the loop assignment and the associated circuit element in each branch are independent of the sub-level system they are in, and the benefits of the invention may be obtained provided that at least one level is structured such that there is at least one current-controlled active switch, inductor or diode in each current loop and that the level includes at least one voltage-controlled active switch or current-controlled active switch in one of the branches.

TABLE 4

Validations of a three-phase full-bridge synchronous rectifier system.

| Config. # | Branch position | | | | | | Circuit element | | | | | | Valid SR config. |
|---|---|---|---|---|---|---|---|---|---|---|---|---|---|
| | 1 | 2 | 3 | 4 | 5 | 6 | A | B | C | D | E | F | |
| | $SX_1$ | $SX_2$ | $SX_3$ | $SX_4$ | $SX_5$ | $SX_6$ | $SX_1 \cup SX_5$ | $SX_1 \cup SX_6$ | $SX_2 \cup SX_4$ | $SX_2 \cup SX_6$ | $SX_3 \cup SX_4$ | $SX_3 \cup SX_5$ | $A \cap B \cap C \cap D \cap E \cap F$ |
| 1 | 0 | 0 | 0 | 1 | 1 | 1 | 1 | 1 | 1 | 1 | 1 | 1 | 1 |
| 2 | 0 | 0 | 1 | 1 | 1 | 1 | 1 | 1 | 1 | 1 | 1 | 1 | 1 |
| 3 | 0 | 1 | 0 | 1 | 1 | 1 | 1 | 1 | 1 | 1 | 1 | 1 | 1 |
| 4 | 0 | 1 | 1 | 0 | 1 | 1 | 1 | 1 | 1 | 1 | 1 | 1 | 1 |
| 5 | 0 | 1 | 1 | 1 | 1 | 1 | 1 | 1 | 1 | 1 | 1 | 1 | 1 |
| 6 | 1 | 0 | 1 | 1 | 0 | 1 | 1 | 1 | 1 | 1 | 1 | 1 | 1 |
| 7 | 1 | 0 | 1 | 1 | 1 | 0 | 1 | 1 | 1 | 1 | 1 | 1 | 1 |
| 8 | 1 | 1 | 0 | 1 | 1 | 0 | 1 | 1 | 1 | 1 | 1 | 1 | 1 |
| 9 | 1 | 1 | 0 | 1 | 1 | 1 | 1 | 1 | 1 | 1 | 1 | 1 | 1 |
| 10 | 1 | 1 | 1 | 0 | 0 | 0 | 1 | 1 | 1 | 1 | 1 | 1 | 1 |
| 11 | 1 | 1 | 1 | 0 | 0 | 1 | 1 | 1 | 1 | 1 | 1 | 1 | 1 |
| 12 | 1 | 1 | 1 | 0 | 1 | 0 | 1 | 1 | 1 | 1 | 1 | 1 | 1 |
| 13 | 1 | 1 | 1 | 0 | 1 | 1 | 1 | 1 | 1 | 1 | 1 | 1 | 1 |
| 14 | 1 | 1 | 1 | 1 | 0 | 0 | 1 | 1 | 1 | 1 | 1 | 1 | 1 |
| 15 | 1 | 1 | 1 | 1 | 0 | 1 | 1 | 1 | 1 | 1 | 1 | 1 | 1 |
| 16 | 1 | 1 | 1 | 1 | 1 | 0 | 1 | 1 | 1 | 1 | 1 | 1 | 1 |
| 17 | 1 | 1 | 1 | 1 | 1 | 1 | 1 | 1 | 1 | 1 | 1 | 1 | 1 |

TABLE 5

Validations of a multi-level cascaded single-phase full-bridge rectifier system.

| | | branch position | | | | | Valid SR in | | | branch position | | | | | Valid SR in |
|---|---|---|---|---|---|---|---|---|---|---|---|---|---|---|---|
| Level 1 | 1 | 2 | 3 | 4 | A | B | Level 1 | Level m | 1 | 2 | 3 | 4 | A | B | Level 2 |
| | | | | | Circuit element | | | | | | | | Circuit element | | |
| Config. # | $SX_1$ | $SX_2$ | $SX_3$ | $SX_4$ | $SX_1 \cup SX_4$ | $SX_2 \cup SX_3$ | $A \cap B$ | Config. # | $SX_1$ | $SX_2$ | $SX_3$ | $SX_4$ | $SX_1 \cup SX_4$ | $SX_2 \cup SX_3$ | $A \cap B$ |
| 1 | 0 | 0 | 1 | 1 | 0 | 1 | 0 | 1 | 0 | 0 | 1 | 1 | 1 | 1 | 1 |
| 2 | 0 | 1 | 0 | 1 | 0 | 1 | 0 | 2 | 0 | 1 | 0 | 1 | 1 | 1 | 1 |
| 3 | 0 | 1 | 1 | 1 | 0 | 1 | 0 | 3 | 0 | 1 | 1 | 1 | 1 | 1 | 1 |
| 4 | 1 | 0 | 1 | 0 | 1 | 1 | 1 | 4 | 1 | 0 | 1 | 0 | 1 | 1 | 1 |
| 5 | 1 | 0 | 1 | 1 | 1 | 1 | 1 | 5 | 1 | 0 | 1 | 1 | 1 | 1 | 1 |
| 6 | 1 | 1 | 0 | 0 | 1 | 1 | 1 | 6 | 1 | 1 | 0 | 0 | 1 | 1 | 1 |
| 7 | 1 | 1 | 0 | 1 | 1 | 1 | 1 | 7 | 1 | 1 | 0 | 1 | 1 | 1 | 1 |
| 8 | 1 | 1 | 1 | 0 | 1 | 1 | 1 | 8 | 1 | 1 | 1 | 0 | 1 | 1 | 1 |
| 9 | 1 | 1 | 1 | 1 | 1 | 1 | 1 | 9 | 1 | 1 | 1 | 1 | 1 | 1 | 1 |

Example 1

A first embodiment of the invention may take the form of a current-source input upper half VCSD full-bridge synchronous rectification (SR) as shown in FIG. 11.

Two p-type power MOSFETs, M1 and M2, replace the upper diodes (D1 and D2 in FIG. 2) of the left and right branches of the diode-bridge. Dm1 and Dm2 can be either the body diode of the two MOSFETs or added external diodes. In this configuration MOSFET M1 has its gate signal controlled by $V_B$ and MOSFET M2 has its gate signal controlled by voltage $V_A$. Both MOSFET gates are cross-connected against the current-source input terminals (point A and point B) through the complementary gate drive circuits formed by the Q1-Q2 pair and Q3-Q4 pair. A gate drive buffer (totem poles, drivers or direct connection) between the current-source input and the MOSFETs can be used to drive the power switches to be ON/OFF accordingly.

Figure 13:
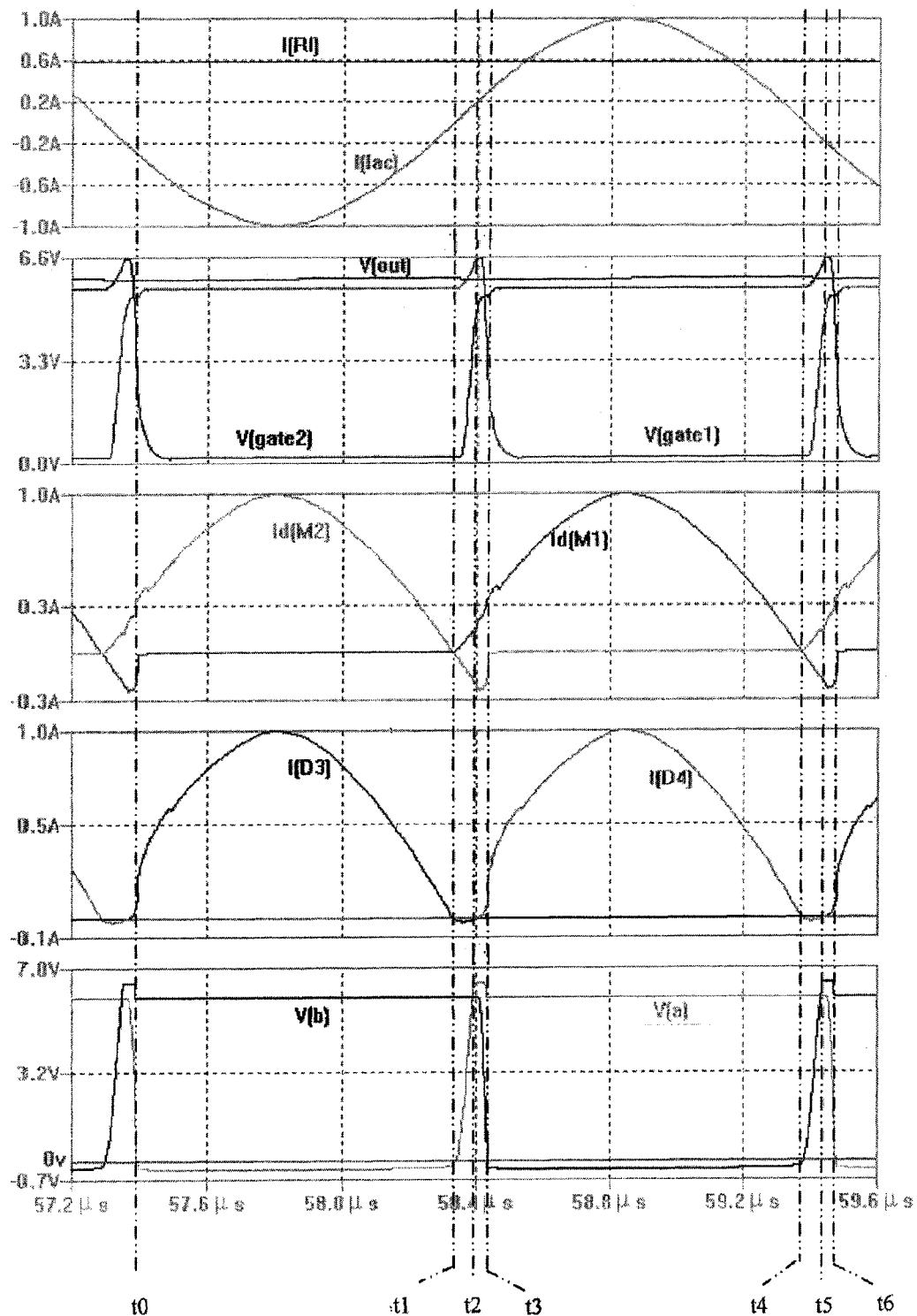
FIG. 13 shows waveforms of the circuit of FIG. 11.

In FIG. 12 and FIG. 13, at time t0 the current direction of the current source starts from point A to point B. Upper right MOSFET M2 is driven to be fully ON by the low voltage appearing at point A. Input current flows to load RL and output filter capacitor Cout in the path of M2 and D3 in t0<t<t1. When the input current reaches zero and reverses its direction from point B to point A, diode D3 is automatically OFF as it is reverse biased, but M2 is still ON as $V_A$ is still kept low. However, M2's current (t1<t<t2) flows in reverse manner and discharges the body capacitance, C1, of M1. Voltage at point A rises linearly and increases the gate voltage of M2. When the negative gate threshold voltage of M2 cannot be sustained, M2 will be OFF, and the voltage $V_A$ keeps increasing until it reaches Vout and starts forward biasing the external diode or body diode of M1 (t2<t<t3). Since the input current is still flowing in reverse direction, it can charge up the body capacitance, C2, of M2, and the voltage of point B, $V_B$, drops off rapidly. When $V_B$ is lower than the negative threshold gate voltage of M1, M1 is caused to conduct. Finally voltage $V_B$ is low enough to let D4 conduct and drive M1 to be fully saturated. Power transfer from current source through D4 and M1 to output is observed (t3<t<t4).

After a half cycle the input current flips over its direction again. Current is no longer flowing through diode D4. M1 is still ON as $V_B$ is low, sustaining the negative threshold gate voltage of M1. Reverse current at M1 starts to discharge capacitance C2 (t4<t<t5). Once the voltage $V_B$ reaches close to Vout, it turns M1 OFF, and C2 is completely discharged. Diode Dm2 catches up the current flow and causes voltage $V_B$ to be high. C1 is discharged (t5<t<t6), and voltage $V_A$ will drop off and finally be low enough to turn M2 ON. A complete current flow from current source to output through D3 and M2 repeats after time t6.

Figure 1A:
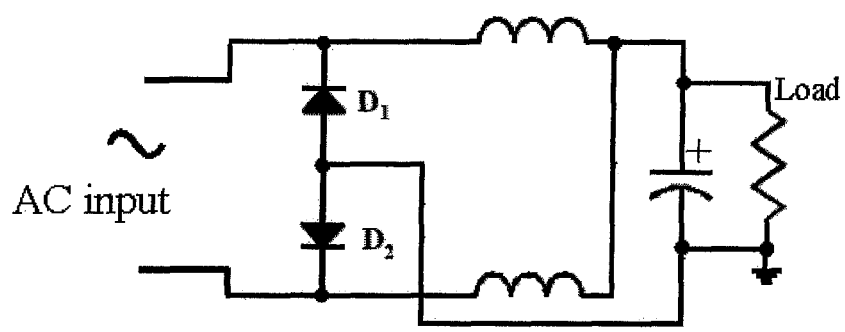
FIG. 1(a) is a circuit diagram of a current doubler rectifier according to the prior art.
Figure 1B:
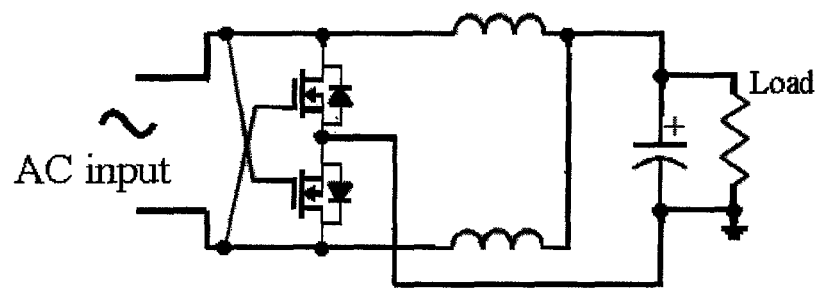
FIG. 1(b) shows the application of self-driven SR to the current doubler of FIG. 1(a)
Figure 2A:
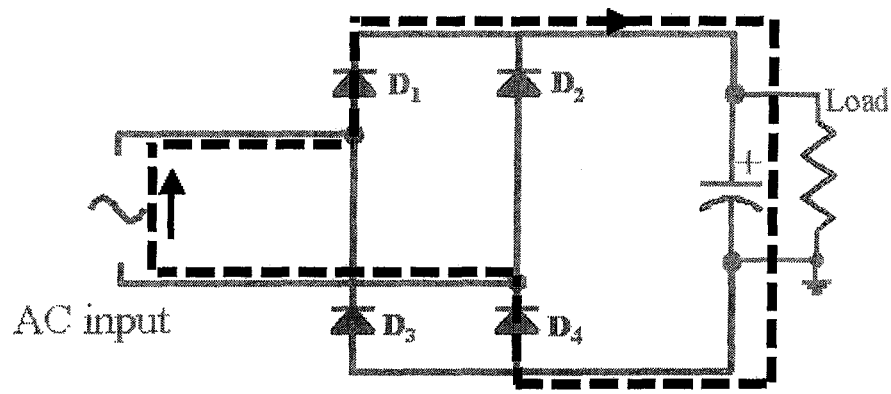
FIG. 2 is diode full-bridge rectifier according to prior art.
Figure 2B:
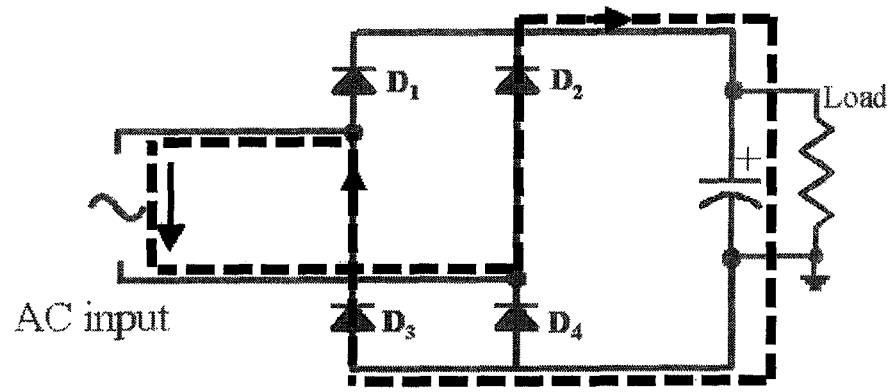
Figure 14:
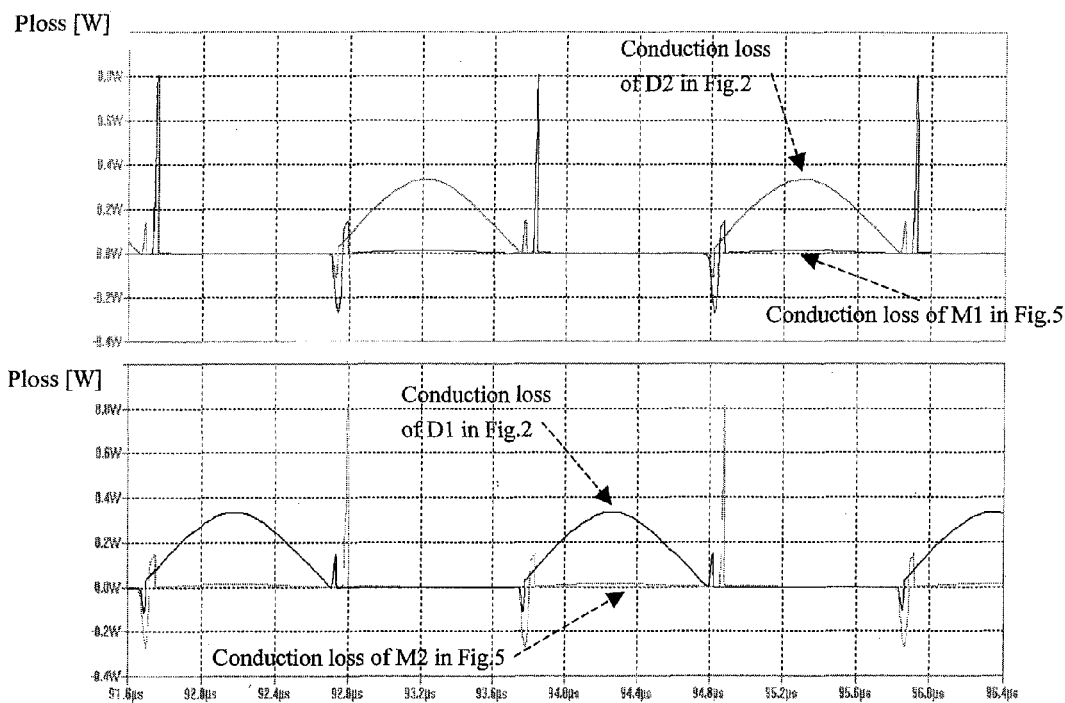
FIG. 14 shows a comparison of conduction losses between Schottky diodes used in a full-bridge rectifier (FIG. 2) and active switches (MOSFETs) used in a SD SR (FIG. 11)

FIG. 14 shows a simulated comparison of conduction losses between Schottky diodes used in FIG. 2 and active switches (e.g. MOSFETs) used in FIG. 11. In the simulation, consider a 1A current source and a load of 10 Ohms as an example. The simulation shows that the conduction loss of each Schottky diode (0.35V forward drop) contributes an average power loss of around 100 mW in a cycle, while each active switch (e.g. MOSFET Si4403DY from Vishay, with 17 mOhmn ON-resistance) introduces an average loss of about 5 mW. The comparative ratio is rather large on the order of ten.

In this example, since a diode exists in each current loop, the two active switches need not be turned off by sensing their reverse current and therefore may be either voltage-controlled or current-controlled active switches. But it must be stressed that the two diodes must be placed in either the upper half of the branches or the lower half of the branches. They must not be placed in the diagonal positions.

Example 2

Figure 15:
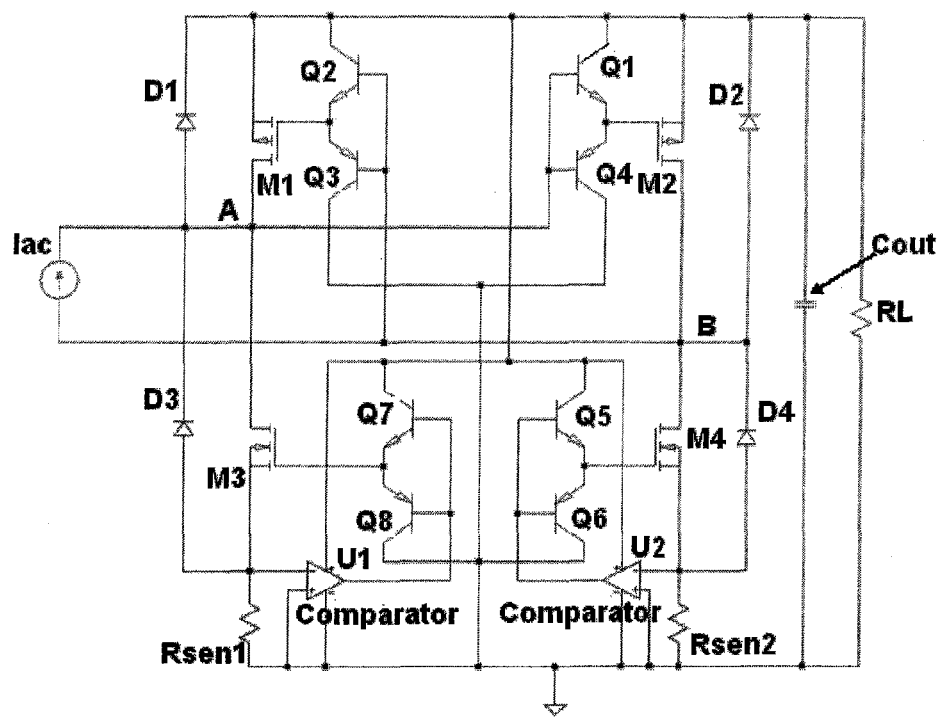
FIG. 15 is a circuit diagram showing a current-source input upper half VCSD and lower half CCSD full-bridge synchronous rectification circuit according to an embodiment of the present invention.

In order to further reduce the power loss in the diodes, a second embodiment of the invention comprises current-source input upper half VCSD and lower half current controlled self-driven' (CCSD) full-bridge synchronous rectification (SR) as shown in FIG. 15. In this case D3 and D4 in FIG. 5 are replaced with two n-type MOSFETs, M3 and M4, respectively.

As shown in FIG. 15, sensing resistors Rsen1 and Rsen2 are placed at both sides of the lower legs for detecting the current flow direction of M3 and M4 (defining positive current flow from ground up to Vout). Comparators U1 and U2 are used to produce driving pulses according to the current flow direction at Rsen1 and Rsen2. The voltage supplies of U1 and U2 can be directly derived from the rectified DC bulk voltage at the DC output, Vout, as this is the most cost effective method (or indirectly derived from an auxiliary power supply). A positive current through M3 and Dm3 or M4 and Dm4 will cause the output of comparator U1 or U2 go to high status. The high voltage level of the comparator output, in turn, will drive the buffer Q5 or Q7 (totem pole or driver). Power switch M3 or M4 will be turned ON according to its positive current flow direction and it will be turned OFF in opposite manner. Two p-type MOSFETs are placed at the upper branch of the bridge, which form the upper half of the SD SR, and the gate drives use voltage control without reverse current sensing.

Figure 17:
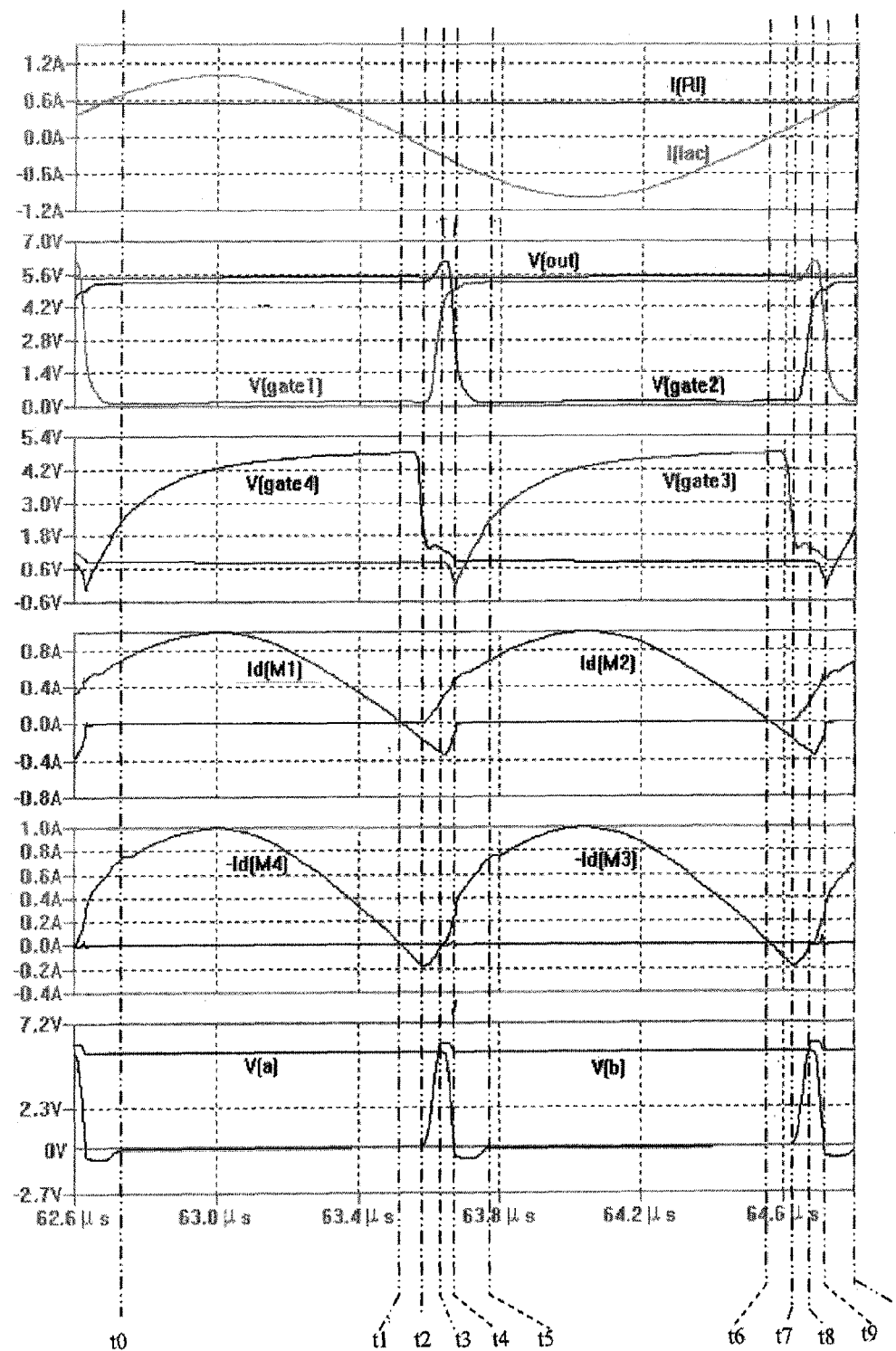
FIG. 17 shows waveforms of the circuit of FIG. 15.

The operation of this embodiment starts at t0. Input current flows from point B to point A in FIG. 16 and FIG. 17. Both power MOSFETs M1 and M4 are ON. Voltage $V_A$ is at the level of Vout, and voltage $V_B$ is at ground level (t0<t<t1). This period finishes when the input current changes its current direction in opposite way. M1 and M4 are still ON for a very short period (t1<t<t2). The reverse voltage developed at Rsen2 will trigger the comparator U2 to flip over, latching buffer Q8. M4 is then OFF. M1 is still ON as $V_B$ is at low state (t2<t<t3). The reverse current flow discharges C2 (external or body capacitance) of M2 in the path (M1, C2) and at the same time charges up C4 of M4 in the path (M1, C4, RL, Cout). In the process of rising to Vout, $V_B$ gradually reduces the negative threshold gate voltage of M1. Eventually M1 is OFF and Dm2 is ON when $V_B$ reaches the output voltage Vout (t3<t<t4). At this moment C1 of M1 is being charged in the path (Dm2, C1) and C3 of M3 is being discharged in the path (Dm2, RL, Cout, C3). $V_A$ drops off and reaches to ground shortly. The low voltage level of $V_A$ and the forward bias of Dm3 (external or body diode) of M3 will cause M2 switch to ON (t4<t<t5). The positive current flow at Rsen1 enables the comparator U1 to drive the buffer Q5. M3 will be then turned ON by its positive current flow, and the next half power transfer cycle begins (t5<t<t6).

This half period ends when the input current changes its current direction. M2 and M3 are still ON for a short period (t6<t<t7). The reverse voltage developed at Rsen1 can cause the comparator U1 to flip over, latching buffer Q6. M3 is then OFF. M2 is still ON as $V_A$ is at a low state (t7<t<t8). The reverse current flow discharges C1 of M1 in the path (M2, C1) and at the same time charges up C3 of M3 in the path (M2, C3, RL, Cout). In the process of rising to Vout, $V_A$ gradually reduces the negative threshold gate voltage of M2. Eventually M2 is OFF and Dm1 is ON when $V_A$ reaches the output voltage Vout (t8<t<t9). At this moment C2 of M2 is being charged in the path (Dm1, C2) and C4 of M4 is being discharged in the path (Dm1, RL, Cout, C4). $V_B$ drops off and reaches to ground shortly. The low voltage level of $V_B$ and the forward bias of Dm4 will cause M1 to turn ON (t9<t<t10). The source current repeats the cycle again.

Figure 18:
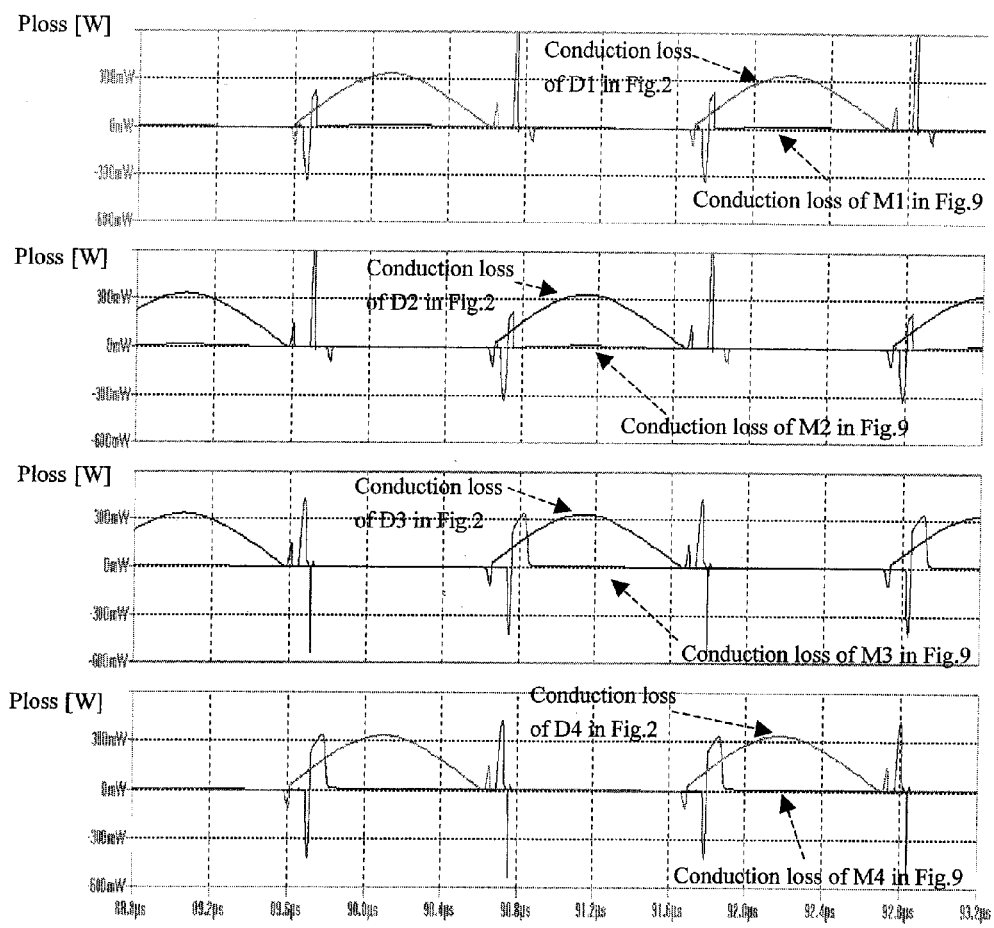
FIG. 18 shows a comparison of conduction losses between Schottky diodes used in a full-bridge rectifier (FIG. 2) and active switches (MOSFETs) used in a SD SR (FIG. 15)

FIG. 18 shows a simulated comparison of conduction losses between Schottky diodes used in FIG. 2 and active switches (e.g. MOSFETs) used in FIG. 15. In the simulation, take 1A current source and a load of 10 Ohms as an example. The simulation shows that the conduction loss of each Schottky diode (0.35V forward drop) contributes an average power loss of around 100 mW in a cycle, while each active switch (e.g. MOSFET Si4403DY from Vishay, with 17 mOhm ON-resistance) introduces an average loss of about 5 mW. The comparative ratio is rather large on the order of ten.

Similar circuit performance can be achieved by putting the two CCSD MOSFETs in the upper half of the rectifier and the two VCSD MOSFETs in the lower half of the rectifier. It must be stressed that the two CCSD MOSFETs must be placed either in the upper half or lower half of the rectifier. It is also feasible that all the four switches in a rectifier are CCSD MOSFETs.

Example 3

Figure 19:
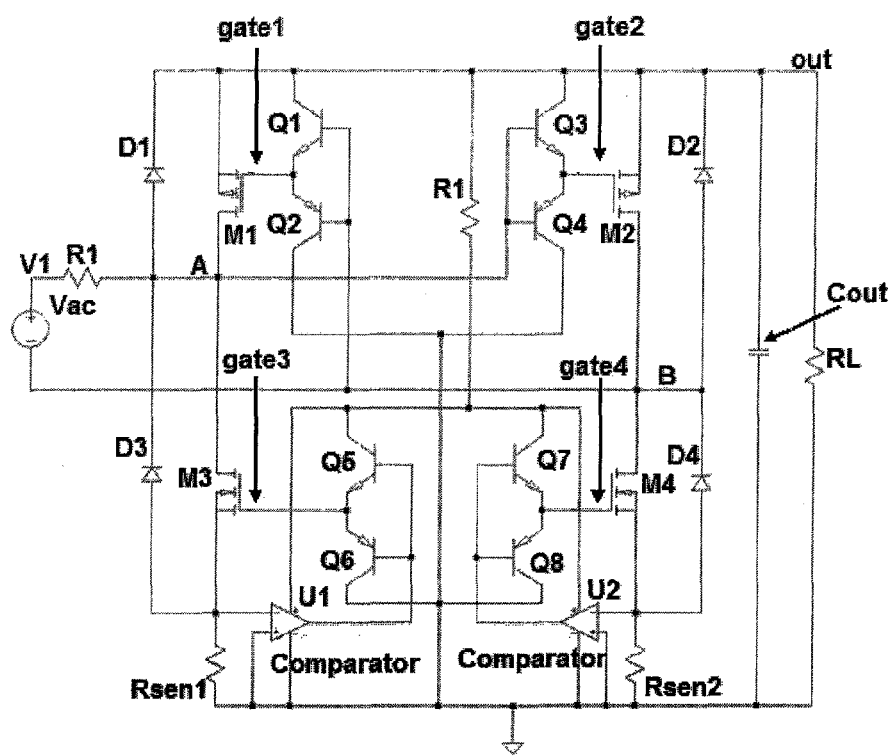
FIG. 19 is a circuit diagram showing a voltage-source input upper half VCSD and lower half CCSD full-bridge synchronous rectification circuit according to an embodiment of the present invention.

A third embodiment of the invention may take the form of voltage-source input upper half VCSD lower half CCSD full-bridge synchronous rectification as shown in FIG. 19.

Figure 21:
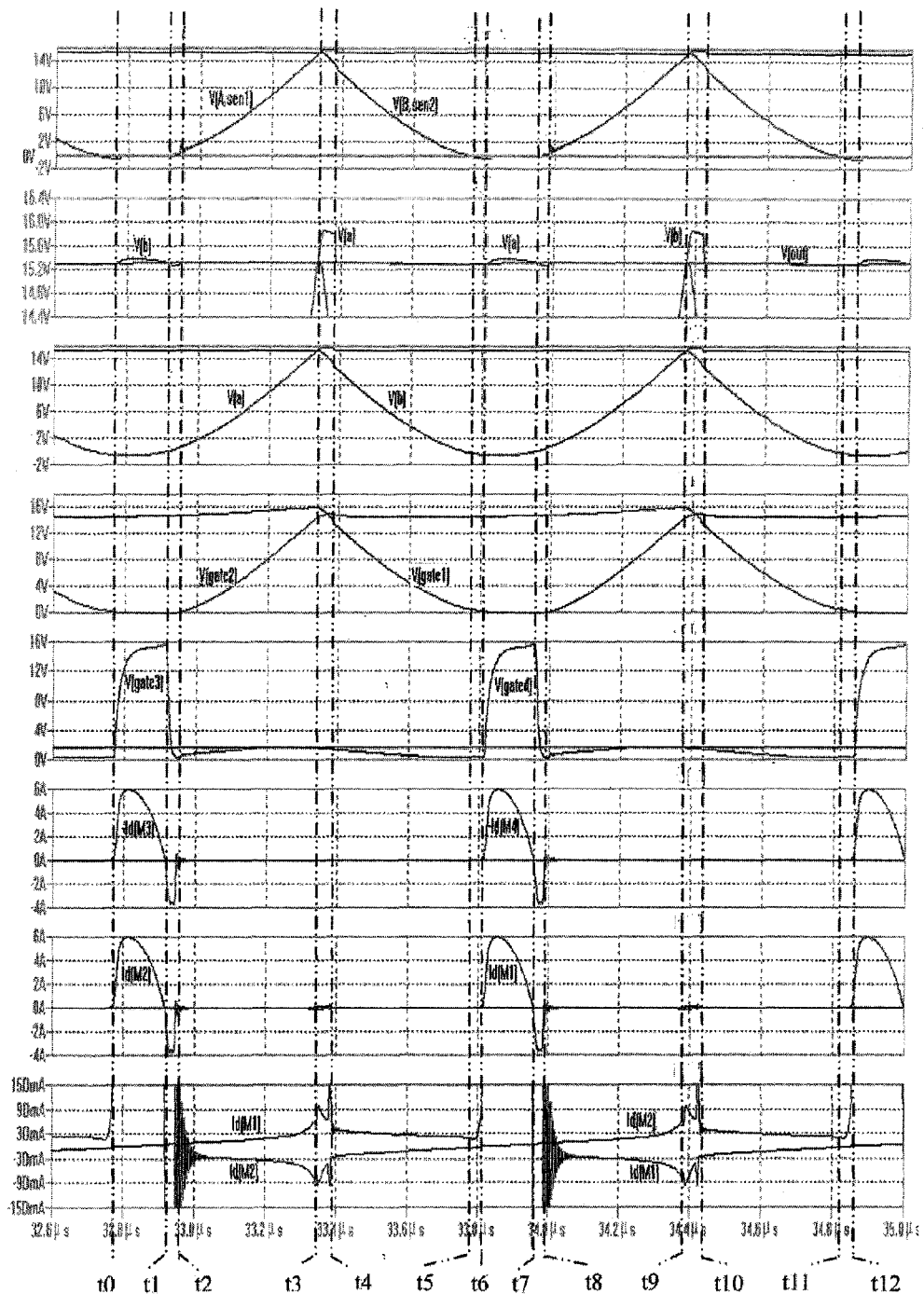
FIG. 21 shows waveforms of the circuit of FIG. 19.

The input of the proposed full-bridge SR can also be a voltage source, besides the current source in examples 1 and 2. A full version of voltage-source-input self-driven full-bridge SR is shown in FIG. 19. Sensing resistors Rsen1 and Rsen2 are placed at both the lower legs of the bridge for detecting the current flow direction (defining positive current flow from ground up to Vout). Comparator U1 and U2 are used to produce driving pulses according to the current flow direction at Rsen1 and Rsen2. A positive current at M3 and Dm3 or M4 and Dm4 will make output of comparator U1 or U2 go to high level. The high voltage level of the comparator, in turn, will drive the buffer Q5 or Q7 (totem pole or driver). Power switch M3 or M4 will be turned ON according to its positive current flow direction and it will be turned OFF in opposite manner. Two p-type MOSFETs are at the upper branches of the bridge, which form the upper half VCSD SR. The operation of this application starts at t0. Input current flows from point A to point B in FIG. 20 and FIG. 21. Both power MOSFETs M2 and M3 are ON. Voltage $V_B$ is at the level of Vout and voltage $V_A$ is at ground level (t0<t<t1). This period finishes when the voltage $V_B$ is less than the output voltage Vout. The input source current keeps continuous flowing but changes its current direction in opposite way (t1<t<t2). The reverse voltage developed at Rsen1 will trigger the comparator U1 to flip over, latching buffer Q6. M3 is then turned off. M2 is still ON as $V_A$ is at a low state, but it stops power transferring to the output in this transition period (t2<t<t3). The reverse current flow discharges C1 (external or body capacitance) of M1 in the path (M2, C1) and at the same time charges up C3 of M3 in the path (M2, C3, RL, Cout). In the process of rising to Vout, $V_A$ gradually reduces the negative threshold gate voltage of M2. Eventually M2 is OFF and Dm1 conducts. $V_A$ reaches the output voltage Vout (t3<t<t4). At this moment C2 of M2 is being charged in the path (Dm1, C2) and C4 of M4 is being discharged in the path (Dm1, RL, Cout, C4). $V_B$ drops off. The fall of $V_B$ creates a negative threshold voltage for M1, which is then turning ON immediately. However, the input AC voltage is far less than the output voltage, Vout. No power is transferred to the output in this transition period (t4<t<t5). Once the voltage $V_B$ is low enough to forward bias the diode Dm4 of M4 (t5<t<t6). The positive current at Rsen2 will trigger the comparator U2 to go high. The output of U2 drives M4 to turn ON by the buffer Q7, and $V_A$ is higher than the output voltage. Power is delivered to the output instantaneously (t6<t<t7).

When the voltage $V_A$ drops below the output voltage level, the reverse current starts to flow (t7<t<t8). The reverse voltage developed at Rsen2 will trigger the comparator U2 to flip over, latching buffer Q8. M4 is then OFF. M1 is still ON as $V_B$ is at a low state, but it stops power transferring to the output in this transition period (t8<t<t9). The reverse current flow discharges C2 of M2 in the path (M1, C2) and at the same time charges up C4 of M4 in the path (M1, C4, RL, Cout). In the process of rising to Vout, $V_B$ gradually reduces the negative threshold gate voltage of M1. Eventually M1 is OFF and Dm2 conducts. $V_B$ reaches the output voltage Vout (t9<t<t10). At this moment C1 of M1 is being charged in the path (Dm2, C1) and C3 of M3 is being discharged in the path (Dm2, RL, Cout, C3). $V_A$ further drops off. The low voltage of $V_A$ also drive M2 into saturation through the buffer Q4 (t10<t<t11). $V_A$ will reach the ground level and forward biasing the diode Dm3 of M3 in (t11<t<t12). The cycle repeats after t12.

Similar circuit performance can be achieved by putting the two CCSD MOSFETs in the upper half of the rectifier and the two VCSD MOSFETs in the lower half of the rectifier. It must be stressed that the two CCSD MOSFETs must be placed either in the upper half or lower half of the rectifier. It is also feasible that all the four switches in a rectifier are replaced by CCSD MOSFETs.

The above examples can be generalized by the following consideration of a full-bridge rectifier having four switches S1-S4 that may be diodes or active switches. The switches are disposed so that two switches S1 and S2 form an upper branch and two switches S3 and S4 form a lower branch, Schematically this may be illustrated as:

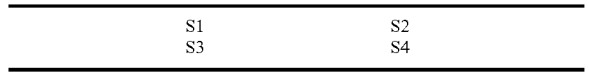

| S1 | S2 |
|----|----|
| S3 | S4 |

The two current loops are diagonals, i.e. one loop comprises switches S1 and S4, and the other current loop comprises switches S3 and S4. If the switches are chosen from voltage-controlled self-driven active switches, current-controlled self-driven active switches and diodes, the critical requirement is that in each current loop there must be either a current-controlled active switch or a diode. The following table illustrates all the possible embodiments of the invention and in which 0 indicates a voltage-controlled active switch, and 1 indicates a current-controlled active switch or a diode.

| S1 | S2 | S3 | S4 |
|----|----|----|----|
| 0  | 0  | 1  | 1  |
| 0  | 1  | 0  | 1  |
| 0  | 1  | 1  | 1  |
| 1  | 0  | 1  | 0  |
| 1  | 0  | 1  | 1  |
| 1  | 1  | 0  | 0  |
| 1  | 1  | 0  | 1  |
| 1  | 1  | 1  | 0  |
| 1  | 1  | 1  | 1  |

It will be seen from a review of the above that in each current loop (i.e. S1+S4 and S2+S3) there is provided either a current-controlled active switch or a diode that will automatically switch off when the switch current direction is reversed, Example 4

Figure 22:
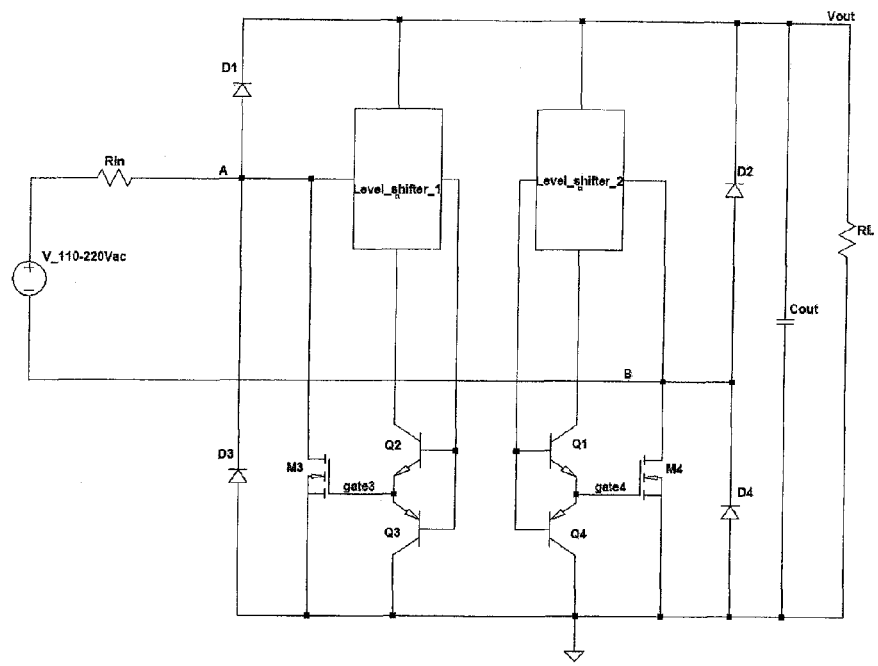
FIG. 22 is a circuit diagram of an AC-to-DC synchronous rectification system according to an embodiment of the invention with 100-220 Vac voltage-source input, VCSD switches in the lower branch.
Figure 23:
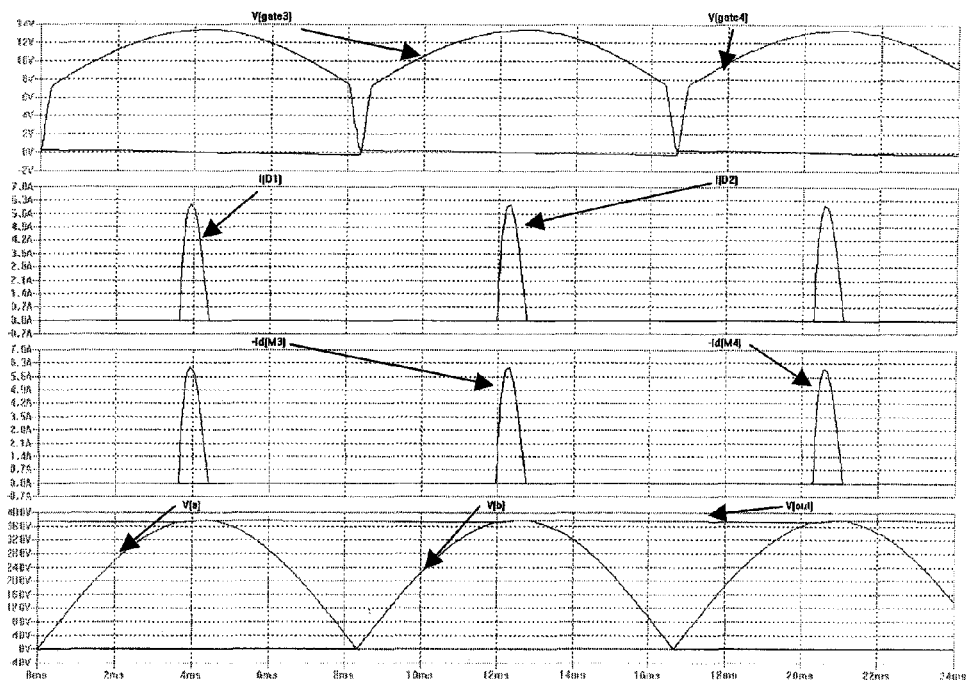
FIG. 23 shows waveforms of FIG. 22.

Embodiments of the present invention, and in particular the embodiments with a voltage source input can be used in a utility power line (e.g. 110 Vac, 220 Vac, 50 Hz, 60 Hz, etc). The basic configurations of such power MOSFETs replacing diodes with the help of totem poles or drivers and the change of polarities of the voltage source facilitate AC power rectification for low and high power applications. In order to have an appropriate voltage driving level to drive the power MOSFETs a level shifter (or any circuits with voltage scaling function) as shown should be added to scale down the rectified bulk voltage for supplying suitable amount of voltage to the gate of the power MOSFETs, as in FIG. 22. FIG. 22 is a single-phase AC-to-DC synchronous rectification system with 100-220 Vac input, VCSD switches in the lower branch. Typical waveforms of the AC-to-DC lower half VCSD synchronous rectifier are shown in FIG. 23. Details of circuit operations are the same as AC-to-DC lower half VCSD synchronous rectifier with voltage-source input as shown in single-phase self-driven full-bridge synchronous rectification as described above.

Figure 24:
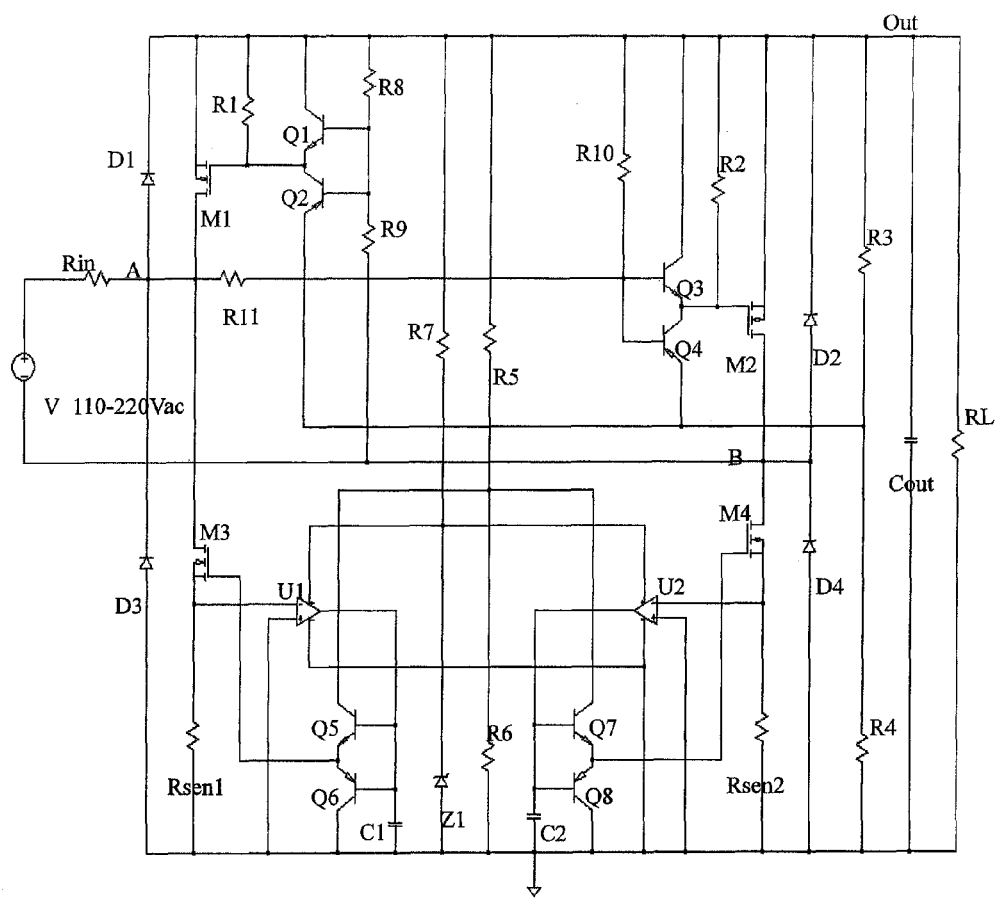
FIG. 24 is a circuit diagram of an AC-to-DC synchronous rectification system according to an embodiment of the invention with 100-220 Vac voltage-source input, CCSD switches in the lower branch and P-channel MOSFET VCSD switches in the upper branch.
Figure 25:
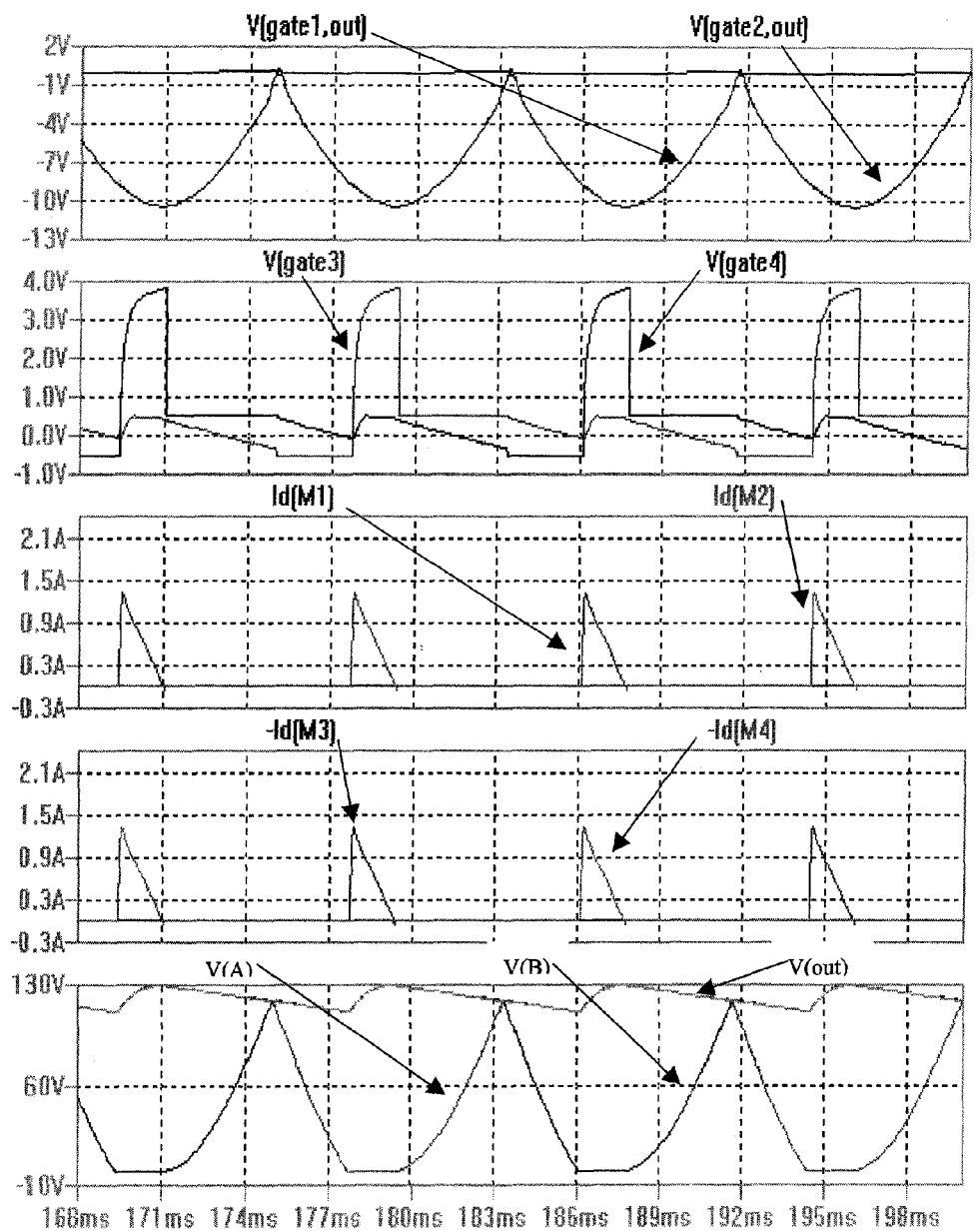
FIG. 25 shows waveforms of FIG. 24.

FIG. 24 shows a single-phase AC-to-DC synchronous rectification system with 110-220 Vac input, CCSD switches in the lower branch and P-channel MOSFET VCSD switches in the upper branch. FIG. 25 shows the waveforms of the circuit in FIG. 24. The use of P-channel MOSFET in the upper branch has the advantage of ease of driving capability. However, the P-channel MOSFET still has higher turn-on resistance than that of N-channel MOSFET. For high power application multiple P-channel MOSFETs can be operated in parallel such that the equivalent turn-on resistance can be greatly reduced. Of course, the alternate approach is to use a N-channel MOSFET switch in the upper branch directly.

Figure 26:
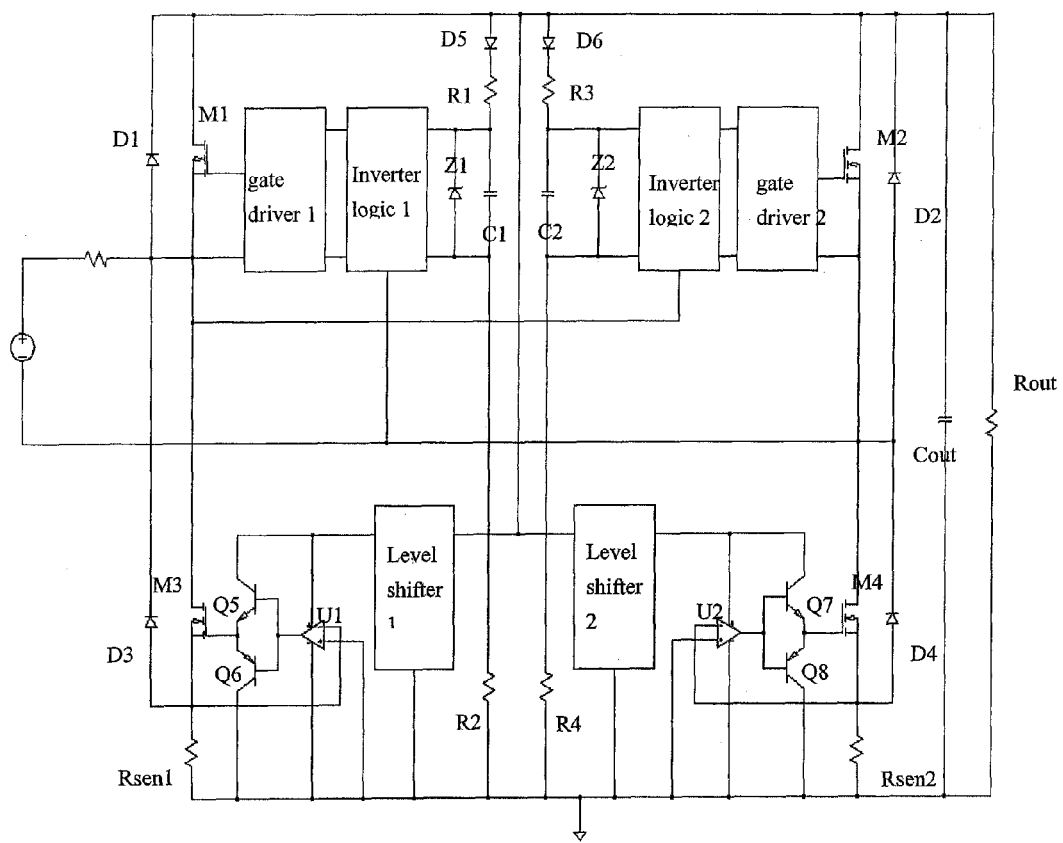
FIG. 26 is a circuit diagram of an AC-to-DC synchronous rectification system according to an embodiment of the invention with 100-220 Vac voltage-source input, CCSD switches in the lower branch and N-channel MOSFET VCSD switches in the upper branch.

FIG. 26 shows a single-phase AC-to-DC synchronous rectification system with 110-220 Vac input, CCSD switches in the lower branch and N-channel MOSFET VCSD switches in the upper branch. In order to drive the N-channel MOSFET switch in the upper branch with floating source terminal, there must be a boost up circuit present. Components D5, D6, Z1, Z2, R1, R2, R3 and R4 form two boost up circuits for switches M1 and M2 respectively. Because of the use of N-channel MOSFET switches in the upper branch, there is also a need for some logic circuits to invert the incoming gate drive signals from voltages at point A and point B before passing the gate signals to the driver circuits. Level shifters are also implemented in FIG. 26 in order to provide suitable supply voltage levels to the lower branch circuits.

Indeed all the above-described embodiments with a voltage-source input can be used for such utility power line applications, including single phase, three-phase, multi-phase or even multilevel rectifications.

It will be understood that embodiments of the present invention can be implemented either using discrete electronic components, or as integrated circuits, and can be used to replace traditional diode rectifier circuits for applications from milli-watt to several tens of kilo-watts. When provided as an integrated package, there are many advantages including high compactness and reduction of heat-sink volume. For example, for a 220V, 10A applications, traditional 1-phase full-bridge rectifier has conduction of around 20 W—assuming 1V voltage drop across the diode and there are 4 diodes. Using an embodiment of the present invention the conduction loss is only 2 W. This greatly reduces the power loss and so the heat-sink requirement is greatly reduced. The circuit can be integrated into a circuit block or independent modules.

Example 5

Figure 27:
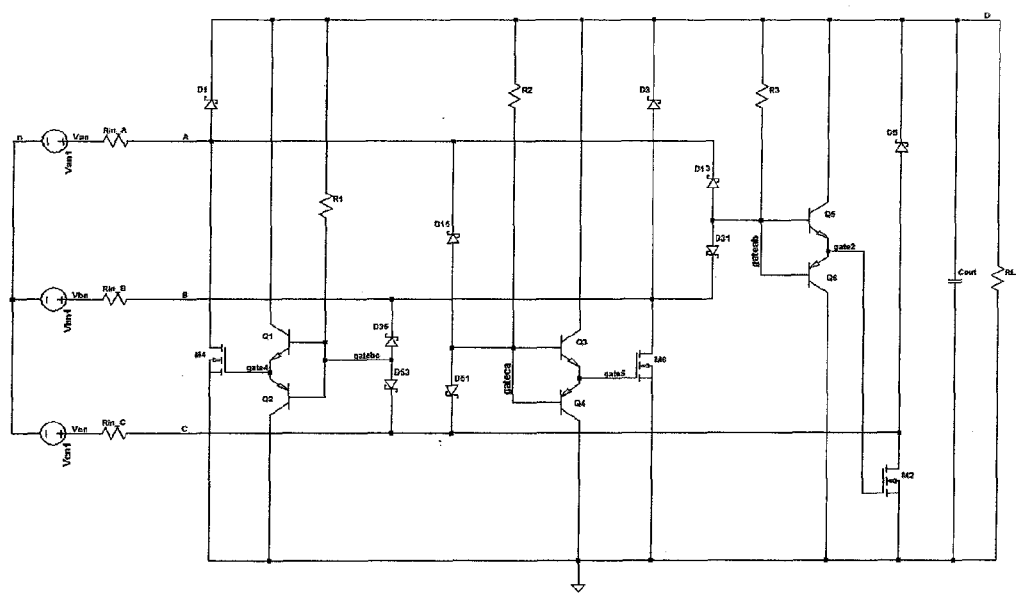
FIG. 27 is a three-phase self-driven lower half VCSD full-bridge synchronous rectification system according to an embodiment of the invention with voltage-source input.
Figure 28:
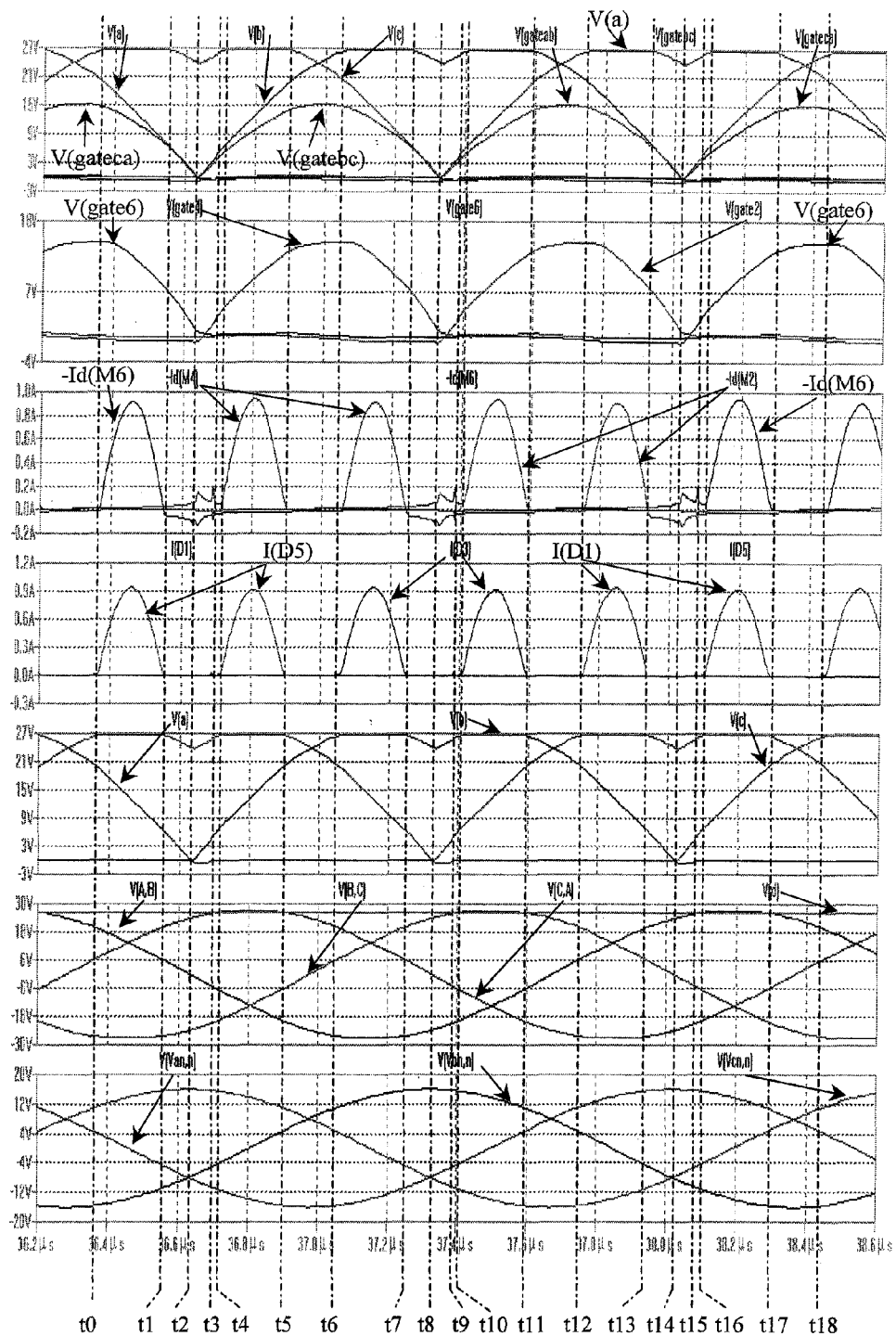
FIG. 28 shows waveforms of FIG. 27.
Figure 29:
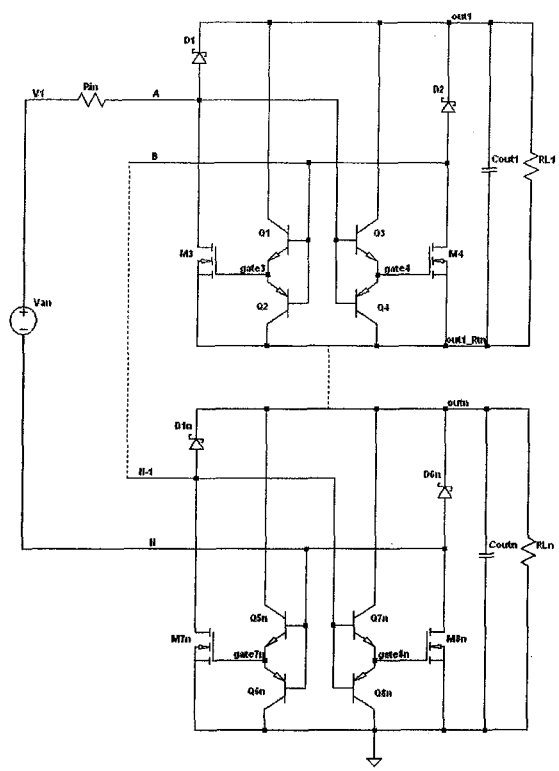
FIG. 29 is a multi-level self-driven lower half VCSD full-bridge synchronous rectification system according to an embodiment of the invention with a voltage-source input.
Figure 30:
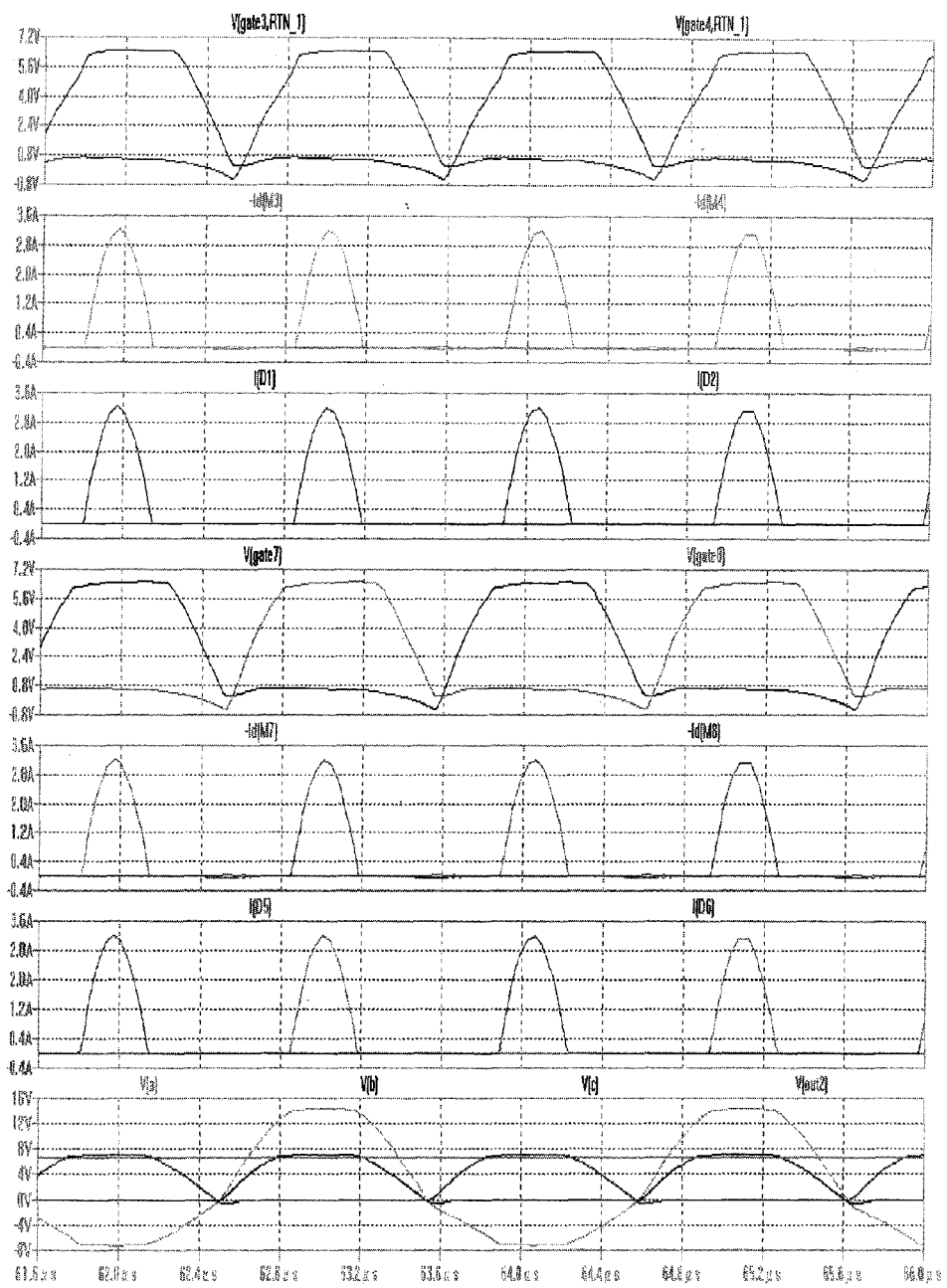
FIG. 30 shows waveforms of a 2-level self-driven lower half VCSD full-bridge synchronous rectification system according to an embodiment of the invention with a voltage-source input.

Another embodiment of the invention may take the form of a three-phase voltage-source input lower half VCSD full-bridge synchronous rectification (SR) as shown in FIG. 27. The above said principle does not only apply to single phase applications, it can also be applied to a three-phase AC system. FIG. 27 shows the three-phase voltage-source input to a lower half VCSD SR. FIG. 28 shows waveforms of FIG. 27. As with the single phase system, the voltage source terminals show the phase of each source voltage (VA, VB, VC) and also phase difference between sources. The driving signal of each phase can be derived from its terminal voltages between adjacent phases through two-diode back-to-back connection or by some logical circuits which can provide logical function "AND" or "OR" functions. Therefore the orientation of the diode depends on which branch (upper half or lower half) of the full-bridge rectifier it is required to drive. For lower half VCSD full-bridge SR the "AND" function should be employed. For upper half VCSD full-bridge SR the "OR" function should be employed. The absolute values of the derived signals (gate_ab, gate_bc, gate_ca) are then used to drive the buffers (totem poles or drivers) which are connected to the gates of the corresponding power MOSFETs. The signal flows can be shown logically as follows:

States of signal flows for driving a three-phase self-driven lower half VCSD full-bridge synchronous rectifier system with voltage-source input.

TABLE 5

| | |
|---|---|
| (VA ∩ VB) → \|V(gate_ab)\| → buffer → V(gate 2) → M2 → VC (high or low) | |
| (VB ∩ VC) → \|V(gate_bc)\| → buffer → V(gate 4) → M4 → VA (high or low) | |
| (VC ∩ VA) → \|V(gate_ca)\| → buffer → V(gate 6) → M6 → VB (high or low) | |

States of signal flows for driving a three-phase self-driven upper half VCSD full-bridge synchronous rectifier system with voltage-source input.

TABLE 6

| | |
|---|---|
| (VA ∪ VB) → \|V(gate_ab)\| → buffer → V(gate 5) → M5 → VC (high or low) | |
| (VB ∪ VC) → \|V(gate_bc)\| → buffer → V(gate 1) → M1 → VA (high or low) | |
| (VC ∪ VA) → \|V(gate_ca)\| → buffer → V(gate 3) → M3 → VB (high or low) | |

Current flow descriptions of a three-phase self-driven upper half VCSD full-bridge synchronous rectifier system with voltage-source input,

TABLE 7

| Duration | Description of operations |
|---|---|
| (t0 < t < t1) | Vcn > Van > Vbn, VC > VA, V(gate_ca) > 0, VA > VB, VCB > Vd, D5 conducts, V(gate6) > 0, M6 conducts, VB = 0. |
| (t1 < t < t2) | Vcn > Van > Vbn, VC < Vd, D5 off, VC > VA, V(gate_ca) > 0, V(gate 6) > 0, M6 conducts, VA drops -> 0, C4 discharged. |
| (t2 < t < t3) | Vcn > Vbn > Van, D4 conducts, VB rises up, M6 off, C6 of M6 charged up |
| (t3 < t < t4) | Vcn > Vbn > Van, VC > VB, V(gate_bc) > 0, V(gate 4) > threshold of M4, M4 conducts, VA = 0, |
| (t4 < t < t5) | Vcn > Vbn > Van, VCA > Vd, D5 conducts, V(gate_bc) > 0, V(gate 4) > 0, M4 conducts. VA = 0. |
| (t5 < t < t6) | (a) Vcn > Vbn > Van, VCA < Vd, D5 off, Vcn > Vbn, V(gate_bc) > 0, V(gate 4) > 0, M4 still conducts but I(M6) = 0. VA = 0. (b) Vbn > Vcn > Van, VBA < Vd, D3 does not conduct yet, V(gate_bc) > 0, V(gate 4) > 0, M4 conducts, I(M4) = 0. |
| (t6 < t < t7) | Vbn > Vcn > Van, VBA > Vd, D3 conducts, V(gate_bc) > 0, V(gate 4) > 0, M4 conducts. VA = 0. |
| (t7 < t < t8) | Vbn > Vcn > Van, VBA < Vd, D3 off, VC drops toward zero, C2 discharged, VBC rises up, V(gate_bc) > 0, V(gate 4) > 0, M4 still conducts, current flows reversely, Vgate4 reaches zero at the end of t8. |
| (t8 < t < t9) | Vbn > Van > Vcn, VBC < Vd, D3 off, VC reaches zero, D2 conducts, M4 off, VA increases. |
| (t9 < t < t10) | Vbn > Van > Vcn, VBC < Vd, D3 off, V(gate_ac) > 0, V(gate 2) > threshold of M2, M2 conducts. |
| (t10 < t < t11) | Vbn > Van > Vcn, VBC > Vd, D3 conducts, V(gate_ac) > 0, V(gate 2) > threshold of M2, M2 still conducts. I(M2) > 0. |
| (t11 < t < t12) | (a) Vbn > Van > Vcn, VBC < Vd, D3 off, Vbn > Van, V(gate_ab) > 0, V(gate 2) > 0, M2 still conducts but I(M2) = 0. VC = 0. (b) Van > Vbn > Vcn, VAC < Vd, D1 does not conduct yet, V(gate_ab) > 0, V(gate 2) > 0, M2 still conducts, but I(M2) = 0. |
| (t12 < t < t13) | Van > Vbn > Vcn, VAC > Vd, D1 conducts, V(gate_ab) > 0, V(gate 2) > 0, M2 conducts. I(M2) > 0, VC = 0. |
| (t13 < t < t14) | Van > Vbn > Vcn, VAC < Vd, D1 off, VB drops toward zero, C6 discharged, VAB rises up, V(gate_ab) > 0, V(gate 2) > 0, M2 still conducts, I(M2) current flows reversely, Vgate2 reaches zero at the end of t14. |
| (t14 < t < t15) | Van > Vcn > Vbn, VAB < Vd, D1 off, VB reaches zero, D6 of M6 conducts, M2 off, VC increases. |
| (t15 < t < t16) | Van > Vcn > Vbn, VAB < Vd, D1 does not conduct yet, V(gate_ac) > 0, V(gate 6) > threshold of M6, M6 conducts. |
| (t16 < t < t17) | Van > Vcn > Vbn, VAB > Vd, D1 conducts, V(gate_ac) > 0, V(gate 6) > threshold of M6, M6 still conducts. I(M6) > 0. |
| (t17 < t < t18) | (a) Van > Vcn > Vbn, VAB < Vd, D1 off, Van > Vcn, V(gate_ac) > 0, V(gate 6) > 0, M6 still conducts but I(M6) = 0. VB = 0. (b) Vcn > Van > Vbn, VCB < Vd, D5 does not conduct yet, V(gate_ac) > 0, V(gate 6) > 0, M6 still conducts, but I(M6) = 0. Cycles repeat after t18. |

Example 7

Figure 31:
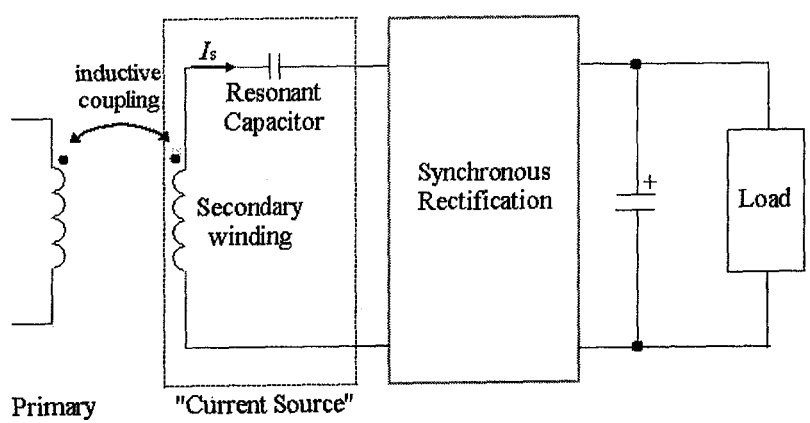
FIG. 31 is a block diagram of a secondary assembly incorporating an SR circuit according to an embodiment of the invention.

An embodiment of an inductively powered secondary assembly including a synchronous rectification circuit is shown in FIG. 31. The secondary winding receives AC energy inductively from the energy transmitter (the primary) when it is placed on or in proximity with the transmitter. The secondary winding, together with the resonant capacitor, forms a resonant tank which can be viewed as an AC current source. It must be noted that more than one winding together with their respect resonant capacitors can be used to form parallel AC current source to improve output power. The current source and the full-bridge synchronous rectification have the same operation modes as described in example 1 or example 2. The decreased power loss due to the use of synchronous rectification can improve the efficiency of the inductive power transfer. For example, if the current through the rectifier is 1A, the power loss due to the rectifier is reduced from 0.6-0.8 W to less than 0.2 W, because the internal resistance of each MOSFET is very low. Such saved loss is critical to the reduction of generated heat, especially when the secondary assembly is placed in any enclosed structure (e.g. in a mobile phone). The output of the secondary assembly can be used to power any DC load, like charging circuit for battery or for other energy storage component.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A rectifier configured to provide synchronous rectification with either a current-source or a voltage-source, said rectifier comprising:
    a first circuit element coupled between a first input node and a first output node;
    a second circuit element coupled between a second input node and the first output node;
    a third circuit element coupled between a second output node and the first input node, the second and third circuit elements forming a first group;
    a fourth circuit element coupled between the second output node and the second input node, the first and fourth circuit elements forming a second group;
    wherein at least one of the circuit elements is a self-driven current-controlled active switch comprising:
        a sensing resistor for sensing a current direction and providing a signal to a gate drive circuit based on the current direction,
        an active switch,
        a comparator comprising a first input pin,
        a voltage bias between the first input pin and the sensing resistor, and also between the first input pin and the active switch, and
    wherein each circuit element comprises one from the group consisting of a diode, an inductor, a capacitor, a voltage-controlled active switch, or the self-driven current-controlled active switch.

2. The rectifier of claim 1 wherein said voltage-controlled active switch is driven by an input alternating current voltage provided to said switch by a gate drive circuit.

3. The rectifier of claim 1 wherein said active voltage-controlled switch comprises a power MOSFET.

4. The rectifier of claim 1 wherein said rectifier is configured to receive a current source.

5. The rectifier of claim 1 wherein said rectifier is configured to receive a voltage source.

6. The rectifier of claim 1 wherein said rectifier comprises only current-controlled active switches and/or diodes in each circuit element.

7. A rectifier configured to provide synchronous rectification with either a current-source or a voltage-source, said rectifier comprising:
    a first circuit element coupled between a first input node and a first output node;
    a second circuit element coupled between a second input node and the first output node;
    a third circuit element coupled between a second output node and the first input node, the second and third circuit elements forming a first group;
    a fourth circuit element coupled between the second output node and the second input node, the first and fourth circuit elements forming a second group;
    wherein at least one of the circuit elements is a self-driven current-controlled active switch comprising:
        a sensing resistor for sensing a current direction and providing a signal to a gate drive circuit based on the current direction,
        a comparator, and
        a capacitor coupled between the sensing resistor and the comparator; and
    wherein each circuit element comprises one from the group consisting of a diode, an inductor, a capacitor, a voltage-controlled active switch, or the self-driven current-controlled active switch.

8. The rectifier of claim 7 wherein said voltage-controlled active switch is driven by an input alternating current voltage provided to said switch by a gate drive circuit.

9. The rectifier of claim 7 wherein said active voltage-controlled switch comprises a power MOSFET.

10. The rectifier of claim 7 wherein said rectifier is configured to receive a current source.

11. The rectifier of claim 7 wherein said rectifier is configured to receive a voltage source.

12. The rectifier of claim 7 wherein said rectifier comprises only current-controlled active switches and/or diodes in each circuit element.

* * * * *